(12) United States Patent
Zuo et al.

(10) Patent No.: US 9,099,986 B2
(45) Date of Patent: Aug. 4, 2015

(54) CROSS-SECTIONAL DILATION MODE RESONATORS

(75) Inventors: Chengjie Zuo, Santee, CA (US); Changhan Yun, San Diego, CA (US); Chi Shun Lo, San Diego, CA (US); Wesley Nathaniel Allen, Lafayette, IN (US); Mario Francisco Velez, San Diego, CA (US); Jonghae Kim, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 355 days.

(21) Appl. No.: 13/295,970

(22) Filed: Nov. 14, 2011

(65) Prior Publication Data

US 2013/0083044 A1 Apr. 4, 2013

Related U.S. Application Data

(60) Provisional application No. 61/541,546, filed on Sep. 30, 2011.

(51) Int. Cl.
*H01L 41/053* (2006.01)
*H03H 9/46* (2006.01)
(Continued)

(52) U.S. Cl.
CPC ............ *H03H 9/462* (2013.01); *H03H 9/2405* (2013.01); *H03H 9/2426* (2013.01); *H03H 2009/02503* (2013.01); *H03H 2009/241* (2013.01)

(58) Field of Classification Search
CPC . H01L 41/0926; H01L 41/047; H01L 41/083; H03H 9/224

USPC .......................................... 310/320, 365, 366
See application file for complete search history.

(56) References Cited

U.S. PATENT DOCUMENTS

| 3,114,849 A | 12/1963 | Poschenrieder |
| 4,076,987 A | 2/1978 | Zumsteg |

(Continued)

FOREIGN PATENT DOCUMENTS

| GB | 2037070 | 7/1980 |
| WO | WO 2013048842 A1 | 4/2013 |
| WO | WO 2013048845 A1 | 4/2013 |

OTHER PUBLICATIONS

International Search Report and Written Opinion—PCT/US2012/056197—ISA/EPO—Feb. 20, 2013.

(Continued)

*Primary Examiner* — Derek Rosenau
*Assistant Examiner* — Bryan Gordon
(74) *Attorney, Agent, or Firm* — Weaver Austin Villeneuve & Sampson LLP

(57) ABSTRACT

Electromechanical systems dilation mode resonator (DMR) structures are disclosed. The DMR includes a first electrode layer, a second electrode layer, and a piezoelectric layer formed of a piezoelectric material. The piezoelectric layer has dimensions including a lateral distance (D), in a plane of an X axis and a Y axis perpendicular to the X axis, and a thickness (T), along a Z axis perpendicular to the X axis and the Y axis. A numerical ratio of the thickness and the lateral distance, T/D, is configured to provide a mode of vibration of the piezoelectric layer with displacement along the Z axis and along the plane of the X axis and the Y axis responsive to a signal provided to one or more of the electrodes. Ladder filter circuits can be constructed with DMRs as series and/or shunt elements, and the resonators can have spiral configurations.

32 Claims, 28 Drawing Sheets

(51) Int. Cl.
*H03H 9/24* (2006.01)
*H03H 9/02* (2006.01)

(56) References Cited

U.S. PATENT DOCUMENTS

| | | | |
|---|---|---|---|
| 4,490,641 | A | 12/1984 | Takeuchi et al. |
| 5,925,968 | A | 7/1999 | Yachi et al. |
| 6,281,619 | B1* | 8/2001 | Yanagisawa et al. ......... 310/370 |
| 6,377,140 | B1 | 4/2002 | Ehara et al. |
| 6,885,260 | B2 | 4/2005 | Nishimura et al. |
| 6,924,715 | B2 | 8/2005 | Beaudin et al. |
| 6,928,301 | B2 | 8/2005 | Souissi et al. |
| 6,967,432 | B2 | 11/2005 | Mitani et al. |
| 6,989,723 | B2 | 1/2006 | Komuro et al. |
| 7,038,358 | B2 | 5/2006 | Bryant et al. |
| 7,145,417 | B2 | 12/2006 | Kimachi et al. |
| 7,492,241 | B2 | 2/2009 | Piazza et al. |
| 7,550,903 | B2 | 6/2009 | Dollgast et al. |
| 7,550,904 | B2 | 6/2009 | Kawakubo et al. |
| 7,554,427 | B2 | 6/2009 | Matsumoto et al. |
| 7,750,759 | B1 | 7/2010 | Lee et al. |
| 7,847,656 | B2 | 12/2010 | Ayazi et al. |
| 2006/0077273 | A1* | 4/2006 | Lee et al. ...................... 348/308 |
| 2007/0252485 | A1* | 11/2007 | Kawakubo et al. ........... 310/365 |
| 2009/0115294 | A1* | 5/2009 | Kikushima ................... 310/370 |
| 2010/0301958 | A1* | 12/2010 | Kawashima ................... 331/163 |
| 2011/0043080 | A1* | 2/2011 | Hirama ......................... 310/366 |
| 2013/0082799 | A1 | 4/2013 | Zuo et al. |

OTHER PUBLICATIONS

International Search Report and Written Opinion—PCT/US2012/056204—ISA/EPO—Feb. 18, 2013.

Khine L et al., "Piezoelectric ALN MEMS resonators with high coupling coefficient," 2011 16th International Solid-State Sensors, Actuators and Microsystems Conference (Transducer 2011); Beijing, China, Jun. 5-9, 2011, IEEE, Piscataway NJ, Jun. 5, 2011, pp. 526-529 XP031910981, DOI:10.1109/ Transducer.2011.5969674 ISBN: 978-1-4577-0157-3.

Zuo C, et al., "Power handling and Related Scaling Advantages in Piezoelectric AlN Contour-mode MEMS resonators", Ultrasonics Symposium (IUS), 2009 IEEE International, IEEE, Piscataway, NJ, USA, 1187-1190, XP031654838, ISBN:978-1-4244-4389-5.

Holland, Richard, "Contour Extensional Resonant Properties of Rectangular Piezoelectric Plates," *IEEE Transaction on Sonics and Ultrasonics*, vol. Su-15, No. 2, Apr. 1968, pp. 97-105.

Piazza, G. et al., "Single-Chip Multiple-Frequency Filters Based on Contour-Mode Aluminum Nitride Piezolelectric Micromechanical Resonators," in *Solid-State Sensors, Actuators and Microsystems*, 2005, Digest of Technical Papers, TRANSDUCERS '05, pp. 2065-2068.

Hashimoto K. Y. Ed., "RF Bulk Acoustic Wave Filters for Communications", 2009, Artech House, Noorwood, MA 351260 ISBN: 978-1-59693-321-7; CH. 2: 2.5; pp. 34-35.

Lanz R., "Piezoelectric Thin Films for Bulk Acoustic Wave Resonator Applications: From Processing to Microwave Filters, Ph.D.", 2004, Ecole Polytechnique Federale de Lausanne, Lausanne—CH. 3: "Ladder Filters based on BAW resonators", pp. 93-98.

Wikipedia: "Lamb waves", pp. 1/8-8/8, Retrieved from the Internet: URL: http://en.wikipedia.org/wiki/Lamb_waves [retrieved on Nov. 25, 2013].

U.S. Office Action dated Mar. 24, 2013, issued in U.S. Appl. No. 13/295,978.

Written Opinion—PCT/US2012/056197—ISA/EPO—Sep. 19, 2013.

International Preliminary Report on Patentability—PCT/US2012/056197—ISA/EPO—Dec. 6, 2013.

Written Opinion—PCT/US2012/056204—ISA/EPO—Sep. 19, 2013.

International Preliminary Report on Patentability—PCT/US2012/056204—ISA/EPO—Dec. 6, 2013.

Zverev, Anatol I., (1967) "Properties of Piezoelectric Quartz Crystals," Handbook of Filter Synthesis, John Wiley & Sons, Chapter 8:414-417, 6 pp, ISBN 0 471 98680 1.

U.S. Final Office Action dated Jan. 2, 2015, issued in U.S. Appl. No. 13/295,978.

Taiwan Search Report—TW101136070—TIPO—Feb. 11, 2015.

* cited by examiner

CROSS-SECTIONAL DILATION MODE RESONATORS

CROSS-REFERENCE TO RELATED APPLICATION

This disclosure claims priority to U.S. Provisional Patent Application No. 61/541,546, filed Sep. 30, 2011, entitled "CROSS-SECTIONAL DILATION MODE RESONATORS", and assigned to the assignee hereof. The disclosure of the prior application is considered part of, and is incorporated by reference in, this disclosure.

TECHNICAL FIELD

This disclosure relates generally to resonators and more specifically to electromechanical systems piezoelectric resonators and circuit topologies.

DESCRIPTION OF THE RELATED TECHNOLOGY

Electromechanical systems (EMS) include devices having electrical and mechanical elements, actuators, transducers, sensors, optical components (including mirrors) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the IMOD. IMOD devices have a wide range of applications, and are anticipated to be used in improving existing products and creating new products, especially those with display capabilities.

Various electronic circuit components can be implemented at the EMS level, such as resonators. Some conventional EMS resonator structures provide less than desirable electrical and mechanical energy conversion, which is often generally referred to in the art as "electromechanical coupling." In some piezoelectric resonator structures, the efficiency of this electromechanical coupling is based on the effectiveness of translation of electrical energy, from an input electrical signal delivered to an input terminal, to mechanical motion of a piezoelectric film that is translated back to electrical energy at the input terminal or an output terminal. Poor electromechanical coupling in a resonator can result in sub-optimal operational efficiency and signal throughput.

Some conventional resonator configurations have a smaller-than-desired electromechanical coupling coefficient ($k_t^2$), which is sometimes used in the art as a numerical representation of electromechanical coupling. For example, in some conventional piezoelectric resonators, lateral dimensions of the piezoelectric film, such as width or length, primarily determine the resonant frequency. Some of these conventional laterally vibrating resonators can have a small $k_t^2$ value, often less than 3%. In some other conventional piezoelectric resonators, such as thin Film Bulk Acoustic Resonators (FBAR), the resonant frequency is primarily determined by the thickness of the piezoelectric film. With such conventional thickness-mode resonators, $k_t^2$ can be higher, for instance around 7%. However, conventional FBARs are generally capable of providing only one resonant frequency, for instance, serving as a center frequency of a filter, per wafer or die. These various factors can limit the performance of conventional resonators in multi-frequency wideband filter applications, such as multi-band/multi-mode wireless communications circuits.

SUMMARY

The structures, devices, apparatus, systems, and processes of the disclosure each have several innovative aspects, no single one of which is solely responsible for the desirable attributes disclosed herein.

Disclosed are implementations of electromechanical systems resonator structures, such as dilation mode resonators (DMR), devices, apparatus, systems, and related fabrication processes.

According to one innovative aspect of the subject matter described in this disclosure, a piezoelectric resonator structure includes a first conductive layer of one or more electrodes, a second conductive layer of one or more electrodes, and a piezoelectric layer formed of a piezoelectric material. The piezoelectric layer is disposed between the first conductive layer and the second conductive layer. The piezoelectric layer has dimensions including a lateral distance (D), in a plane of an X axis and a Y axis perpendicular to the X axis, and a thickness (T), along a Z axis perpendicular to the X axis and the Y axis. A numerical ratio of the thickness and the lateral distance, T/D, is configured to provide a mode of vibration of the piezoelectric layer with displacement along the Z axis and along the plane of the X axis and the Y axis responsive to a signal provided to one or more of the electrodes.

In some implementations, the lateral distance of the piezoelectric layer is a width along the X axis, and the displacement of the piezoelectric layer occurs along the Z axis and along the X axis. In some implementations, the lateral distance of the piezoelectric layer is a length along the Y axis, and the displacement of the piezoelectric layer occurs along the Z axis and along the Y axis. In some other implementations, the lateral distance is situated in the X-Y plane, but has an angular offset from the X and/or Y axes. In some implementations, the mode of vibration is a 2D mode of vibration. In some other implementations, the mode of vibration is a 3D mode of vibration.

In some implementations, the numerical ratio T/D, is in a designated range associated with an electromechanical coupling. The designated range can include a first range associated with a first electromechanical coupling and a second range associated with a second electromechanical coupling different from the first electromechanical coupling. The first electromechanical coupling can be variable in relation to the numerical ratio T/D, in the first range. In some examples, the second electromechanical coupling is higher than the first electromechanical coupling.

In some implementations, the Z axis bisects the piezoelectric layer, and the mode of vibration has a symmetrical shape with respect to the Z axis. The mode of vibration can be associated with a combination of coefficients of the piezoelectric material, such as a d31 coefficient, a d32 coefficient, a d33 coefficient, a d24 coefficient and a d15 coefficient.

In some implementations, the first conductive layer of one or more electrodes covers a substantial portion of a first surface of the piezoelectric layer. The second conductive layer of one or more electrodes also can cover a substantial portion of a second surface of the piezoelectric layer.

According to another innovative aspect of the subject matter described in this disclosure, an apparatus includes a piezoelectric resonator structure as described above, a display, a processor configured to communicate with the display and configured to process image data, and a memory device configured to communicate with the processor. One or more of the electrodes of the piezoelectric resonator structure can be coupled to send the image data to the processor.

According to another innovative aspect of the subject matter described in this disclosure, a piezoelectric resonator structure includes first conductive means for receiving an input signal, second conductive means for providing an output signal, and piezoelectric means formed of a piezoelectric material and disposed in proximity to the first conductive means and the second conductive means. The piezoelectric means has dimensions including a lateral distance (D), in a plane of an X axis and a Y axis perpendicular to the X axis, and a thickness (T), along a Z axis perpendicular to the X axis and the Y axis. The piezoelectric means has a numerical ratio of the thickness and the lateral distance, T/D, for providing a mode of vibration with displacement along the Z axis and along the plane of the X axis and the Y axis responsive to a signal provided to one or more of the electrodes.

According to another innovative aspect of the subject matter described in this disclosure, a plurality of resonators each include: a first conductive layer including an electrode, a second conductive layer including an electrode, and a piezoelectric layer formed of a piezoelectric material and disposed between the first conductive layer and the second conductive layer. The piezoelectric layer has dimensions including a lateral distance (D), in a plane of an X axis and a Y axis perpendicular to the X axis, and a thickness (T), along a Z axis perpendicular to the X axis and the Y axis. A numerical ratio of the thickness and the lateral distance, T/D, is configured to provide a mode of vibration of the piezoelectric layer with displacement along the Z axis and along the plane of the X axis and the Y axis responsive to a signal provided to one or more of the electrodes. One of the resonators is a series resonator, with its first conductive layer electrode coupled to an input terminal, and its second conductive layer electrode coupled to an output terminal. Another one of the resonators is a first shunt resonator, with its first conductive layer electrode coupled to the input terminal or the output terminal, and its second conductive layer electrode coupled to ground.

In some implementations, a second shunt resonator has a first conductive layer electrode coupled to the input terminal or the output terminal, and a second conductive layer electrode coupled to ground. In some implementations, the series resonator is associated with a series resonant frequency, and the first shunt resonator is associated with a parallel resonant frequency different from the series resonant frequency. For example, a difference between the parallel resonant frequency and the series resonant frequency can define a passband. In some implementations, a shunt inductor is coupled between the second conductive layer electrode of the first shunt resonator and ground.

In some implementations, one or more of the resonators have a spiral shape in a plane. The spiral shape can have a rectangular, circular, oval, or octagonal contour, by way of example.

According to another innovative aspect of the subject matter described in this disclosure, a ladder filter system includes a plurality of resonators as described above. A first ladder filter device includes a series resonator with its first conductive layer electrode coupled to a first ladder filter input terminal, and its second conductive layer electrode coupled to a first ladder filter output terminal. The first ladder filter device also includes one or more shunt resonators having first conductive layer electrodes coupled to the first ladder filter input terminal or the first ladder filter output terminal, and second conductive layer electrodes coupled to ground. A second ladder filter device includes a series resonator, with its first conductive layer electrode coupled to the first ladder filter output terminal, and its second conductive layer electrode coupled to a second ladder filter output terminal. The second ladder filter device includes one or more shunt resonators having first conductive layer electrodes coupled to the first ladder filter output terminal or the second ladder filter output terminal, and second conductive layer electrodes coupled to ground.

In some implementations, a first shunt inductor is coupled between the second conductive layer electrodes of the shunt resonators of the first ladder filter device and ground. Also, a second shunt inductor can be coupled between the second conductive layer electrodes of the shunt resonators of the second ladder filter device and ground.

According to another innovative aspect of the subject matter described in this disclosure, a resonator device includes a first conductive layer including one or more electrodes, a second conductive layer including one or more electrodes, and a piezoelectric layer formed of a piezoelectric material and disposed between the first conductive layer and the second conductive layer. The piezoelectric layer is configured to provide a mode of vibration responsive to a signal provided to one or more of the conductive layers, and the piezoelectric layer has a spiral configuration in a plane. In some implementations, the piezoelectric layer has a total length in the plane that can be associated with a resistance parameter, an impedance parameter, or a capacitance parameter.

In some implementations, the series resonator in a ladder filter device has a first parameter associated with a series resonant frequency, and the shunt resonator has a second parameter associated with a parallel resonant frequency different from the series resonant frequency of the series resonator. For instance, the first parameter can be a distance or a combination of distances such as a width, a length, and/or a thickness of the series resonator piezoelectric layer. The second parameter can be a distance or a combination of distances such as a width, a length, and/or a thickness of the shunt resonator piezoelectric layer.

According to another innovative aspect of the subject matter described in this disclosure, a ladder filter device includes a plurality of resonators, with each resonator including: first conductive means for receiving an input signal, second conductive means for providing an output signal in response to the input signal, and piezoelectric means for providing a mode of vibration responsive to the input signal. The piezoelectric means is disposed between the first conductive means and the second conductive means. The piezoelectric means has dimensions including a lateral distance (D), in a plane of an X axis and a Y axis perpendicular to the X axis, and a thickness (T), along a Z axis perpendicular to the X axis and the Y axis. A numerical ratio of the thickness and the lateral distance, T/D, is configured to provide the mode of vibration with displacement along the Z axis and along the plane of the X axis and the Y axis responsive to the input signal. One of the resonators is a series resonator. The first conductive means of the series resonator is coupled to an input terminal, and the second conductive means of the series resonator is coupled to an output terminal. Another one of the resonators is a first shunt resonator. The first conductive means of the first shunt resonator is coupled to the input terminal or the output terminal, and the second conductive means of the first shunt resonator is coupled to ground.

Details of one or more implementations of the subject matter described in this specification are set forth in the accompanying drawings and the description below. Although the examples provided in this disclosure are primarily described in terms of electromechanical systems (EMS) and microelectromechanical systems (MEMS)-based displays, the concepts provided herein may apply to other types of displays, such as liquid crystal displays, organic light-emitting diode ("OLED") displays and field emission displays. Other features, aspects, and advantages will become apparent from the description, the drawings, and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
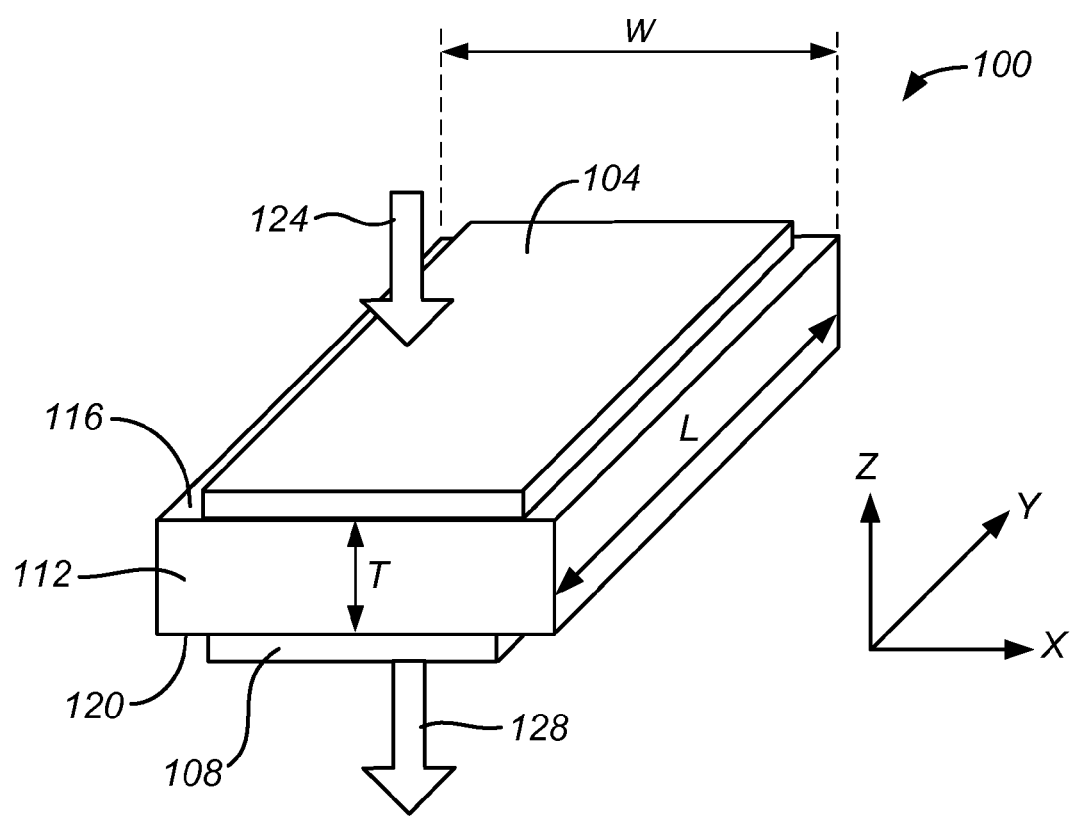
FIG. 1 shows an example of a perspective view of a dilation mode resonator (DMR) structure.

The following detailed description is directed to certain implementations for the purposes of describing the innovative aspects. However, the teachings herein can be applied in a multitude of different ways.

The disclosed implementations include examples of structures and configurations of electromechanical systems resonator devices, including dilation mode resonators (DMR). Related apparatus, systems, and fabrication processes and techniques are also disclosed. Some examples of the disclosed DMRs have a two-dimensional (2D) mode of vibration in a cross-section of the resonator structure, with displacement and deformation along the thickness of the resonator and along the width or length of the resonator, as described in greater detail below. Other examples of the disclosed DMRs have a three-dimensional (3D) mode of vibration, with displacement and deformation along both a thickness-width cross-section and a thickness-length cross-section of the resonator structure. In some configurations, the disclosed DMRs provide higher electromechanical coupling than is possible with some conventional resonators.

In the case of piezoelectric DMRs, electrodes are generally disposed in contact with or in proximity to a piezoelectric material. For instance, the electrodes can be located on the same surface or on opposite surfaces of a layer of the piezoelectric material. An electric field applied between electrodes is transduced into a mechanical strain in the piezoelectric material. For instance, a time-varying electrical signal can be provided to an input electrode of the DMR and transduced to a corresponding time-varying mechanical motion. A portion of this mechanical energy can be transferred back to electrical energy at the input electrode or at a separate output electrode. The frequency of the input electrical signal that produces the greatest substantial amplification of the mechanical displacement in the piezoelectric material is generally referred to as a resonant frequency of the DMR.

In some implementations of the disclosed DMRs, the piezoelectric material has a 2D mode of vibration, that is, with a geometrical vibration shape in two dimensions, in a cross-section of the resonator. This cross-section includes a lateral dimension, i.e., a width or length of the resonator structure, in combination with a vertical dimension, i.e., a thickness of the resonator. Thus, the 2D mode of vibration can be along a width-thickness cross-section or a length-thickness cross-section of the resonator structure, depending on the desired implementation. As explained in greater detail below, the geometric shape of the 2D mode of vibration in the cross-section has effects from both the thickness and one of the lateral dimensions of the resonator. Two or more piezoelectric coefficients, such as the d31 coefficient, the d32 coefficient, the d33 coefficient, the d24 coefficient, and the d15 coefficient, of the piezoelectric layer can be combined and harnessed to transduce the cross-sectional 2D vibration mode and achieve desirably high electromechanical coupling.

In some implementations of the disclosed DMRs, the piezoelectric material has a three-dimensional (3D) mode of vibration, that is, with a geometrical vibration shape in three dimensions. In such implementations, the piezoelectric material can vibrate along both a width-thickness cross-section and a length-thickness cross-section of the resonator structure, depending on the thickness, width, and length parameters as described in greater detail below. Thus, in some examples, the 3D mode of vibration encompasses two cross-sectional 2D modes of vibration, that is, with displacement and deformation along both the width-thickness cross-section ($1^{st}$ 2D mode of vibration) and the length-thickness cross-section ($2^{nd}$ 2D mode of vibration). In such examples, the geometrical shape of the 3D mode of vibration has effects from the thickness and both of the lateral dimensions (width and length) of the resonator.

In some implementations, ladder-type filter circuits can be constructed to include the disclosed DMRs, for instance, as series and shunt circuit elements. Various ladder filter topologies can be implemented with the disclosed resonator structures, as further described in the examples below. For instance, the parallel resonant frequency of a shunt resonator and the series resonant frequency of a series resonator can define the bandwidth. In some examples, two or more shunt resonators can be coupled in parallel to provide increased out-of-band attenuation. In some examples, two or more ladder filters can be cascaded in stages to provide additional out-of-band attenuation. In some examples, one or more shunt inductors can be connected with shunt resonators to achieve better out-of-band rejection, null frequency control, and passband roll-off slope adjustment in the disclosed ladder filters. Resonator structures as disclosed herein also can be spiral-shaped, for example, with longer lengths and small form factors. The disclosed spiral-shaped resonators can have various serpentine configurations, concentric multiple turns, and contours including rectangular shapes, circular shapes, oval shapes, and octagonal shapes.

Particular implementations of the subject matter described in this disclosure can be implemented to realize one or more of the following potential advantages. Examples of resonator structures disclosed herein can provide the benefits of multiple frequency operations on a single chip, where resonant frequency is at least partially determined by lateral dimensions of the resonator structure, i.e., width and/or length, in combination with higher electromechanical coupling. For instance, $kt^2$ values greater than 10% can be achieved for resonators with aluminum nitride (AlN) as the piezoelectric material, and $kt^2$ greater than 18% can be achieved for resonators with zinc oxide (ZnO) as the piezoelectric material. Such high values can be desirable, for instance, for wideband filter applications with multiple frequency operations on the same chip.

In some implementations, a 2D mode of vibration in the cross-section with enhanced electromechanical coupling is based on a numerical ratio of the thickness and the width or the length of the resonator structure, as described in greater detail below. Thus, the thickness is one parameter, and the width or the length is another parameter, both of which can be substantially controlled to engineer the numerical ratio to achieve a desired geometric mode shape in the cross-section of the resonator. Multi-frequency RF filters, clock oscillators, transducers and other devices, each including one or more DMRs depending on the desired implementation, can be fabricated on the same substrate. For example, this may be advantageous in terms of cost and size by enabling compact, multi-band filter solutions for RF front-end applications on a single chip. In some examples, by co-fabricating multiple DMRs on the same die, multiple frequencies can be addressed. In some examples, arrays of DMRs with different frequencies spanning a range from MHz to GHz can be fabricated on the same substrate. Such DMRs can be configured in cascaded stages or in ladder, lattice, or other hybrid filter topologies as desired for the particular implementation.

With the disclosed DMRs, direct frequency synthesis for spread spectrum communication systems may be enabled by multi-frequency high quality factor (Q) DMR resonator banks, without the need for phase locked loops. The high $kt^2$ and high Q DMRs also can enable voltage-controlled oscillators (VCOs) with very large tuning range, for instance, greater than 5%, and low phase noise. The disclosed DMR implementations can provide for piezoelectric transduction with low motional resistance while maintaining high Q factors and appropriate reactance values that facilitate their interface with contemporary circuitry. Some examples of the disclosed resonator structures provide the advantages of compact size, e.g., on the order of several micrometers in width and/or thickness, low power consumption, and compatibility with high-yield mass-producible components (for example, CMOS circuits).

Additional potential advantages of some implementations of the disclosed subject matter can be realized. For instance, the bandwidths of the passbands of the disclosed ladder filter circuits can be set according to the resonant frequencies of series and/or shunt resonators incorporated into the ladder filter circuit. The attenuation of any out-of-band frequencies also can be enhanced using cascaded ladder filter blocks incorporating shunt resonators and inductors. In addition, when the disclosed resonator structures are spiral-shaped and properly designed, spurious frequencies of the resonator can be attenuated, and the resonant frequencies can be controlled according to one or more dimensions of the spiral-shaped structure.

In one or more implementations of the disclosed DMRs, the resonator structure is suspended in a cavity of a supporting structure and generally includes two conductive electrode layers, with a layer of piezoelectric material sandwiched between the two electrode layers. The resonator structure can be suspended in the cavity by specially designed tethers coupling the resonator structure to the supporting structure, as further explained below. These tethers are often fabricated in the layer stack of the resonator structure itself. The resonator structure can be acoustically isolated from the surrounding structural support and other apparatus by virtue of the cavity.

The disclosed resonator structures can be fabricated on a low-cost, high-performance, large-area insulating substrate, which, in some implementations, forms at least a portion of the supporting structure described herein. In some implementations, the insulating substrate on which the disclosed resonator structures are formed can be made of display grade glass (alkaline earth boro-aluminosilicate) or soda lime glass. Other suitable insulating materials of which the insulating substrate can be made include silicate glasses, such as alkaline earth aluminosilicate, borosilicate, modified borosilicate, and others. Also, ceramic materials such as aluminum oxide (AlOx), yttrium oxide ($Y_2O_3$), boron nitride (BN), silicon carbide (SiC), aluminum nitride (AlNx), and gallium nitride (GaNx) can be used as the insulating substrate material. In some other implementations, the insulating substrate is formed of high-resistivity silicon. In some implementations, silicon On Insulator (SOI) substrates, gallium arsenide (GaAs) substrates, indium phosphide (InP) substrates, and plastic (polyethylene naphthalate or polyethylene terephthalate) substrates, e.g., associated with flexible electronics, also can be used. The substrate can be in conventional Integrated Circuit (IC) wafer form, e.g., 4-inch, 6-inch, 8-inch, 12-inch, or in large-area panel form. For example, flat panel display substrates with dimensions such as 370 mm×470 mm, 920 mm×730 mm, and 2850 mm×3050 mm, can be used.

In some implementations, the disclosed resonator structures are fabricated by depositing a sacrificial (SAC) layer on the substrate; forming a lower electrode layer on the SAC layer; depositing a piezoelectric layer on the lower electrode layer; forming an upper electrode layer on the piezoelectric layer; and removing at least part of the SAC layer to define a cavity. The resulting resonator cavity separates at least a portion of the lower electrode layer from the substrate and provides openings along the sides of the resonator structure, as illustrated in the accompanying figures, to allow the resonator to vibrate and move in one or more directions with substantial elastic isolation from the remaining substrate. In some other implementations, a portion of the substrate itself serves as a SAC material. In these implementations, designated regions of the insulating substrate below the resonator structure can be removed, for example, by etching to define the cavity.

FIG. 1 shows an example of a perspective view of a DMR structure. In FIG. 1, the structure 100 includes an upper conductive layer 104 of one or more electrodes. The structure 100 also includes a lower conductive layer 108 of one or more electrodes offset from the upper conductive layer 104 along a Z axis. A piezoelectric layer 112 is disposed between the upper conductive layer 104 and the lower conductive layer 108. In this example, the piezoelectric layer 112 has an upper surface 116 and a lower surface 120 opposite the upper surface 116. In this example, the upper surface 116 is in contact with the upper conductive layer 104, and the lower surface 120 is in contact with the lower conductive layer 108.

In FIG. 1, the piezoelectric layer 112 has dimensions including a width, W, oriented along an X axis, a length, L, oriented along a Y axis perpendicular to the X axis, and a thickness, T, along the Z axis, which is perpendicular to the X axis and the Y axis. As mentioned above, W and L are examples of lateral distances, D, which generally lie in a plane along the X axis and the Y axis. As described in greater detail herein, a numerical ratio of the thickness and the lateral distance, T/D, can be configured to provide a 2D mode of vibration of the piezoelectric layer 112 with displacement along the Z axis and along the lateral distance, D, which is in a lateral plane perpendicular to the Z axis and can be along the X axis in some examples, along the Y axis in some other examples, or offset from the X and/or Y axes as further explained below, responsive to a signal provided to one or more of the electrodes in the conductive layers 104 and 108. For example, an input AC signal 124 having a frequency causing the structure 100 to vibrate at a resonant frequency can be provided to one or more electrodes of upper conductive layer 104, and a resulting output signal 128 having the resonant frequency can be sensed at one or more electrodes of upper conductive layer 104 or lower conductive layer 108.

While the piezoelectric layer 112 of FIG. 1 is represented as a rectangular prism or cube, with dimensions oriented along respective X, Y, and Z axes as described above, it should be understood that this representation is for illustrative purposes only. In some implementations, the piezoelectric layer 112 has an amorphous 3D shape. In such implementations, as well as the other rectangular implementations illustrated in the various Figures and described herein, the lateral distance, D, can have various different orientations in a lateral X-Y plane perpendicular to the Z axis, including situations in which D is offset from the defined X axis by a first angle, and/or offset from the Y axis by a second angle. Thus, while many of the implementations herein are described as having a lateral distance along the X or Y axis, it should be understood that the disclosed principles of configuring a numerical ratio of the thickness and the lateral distance, T/D, to provide a 2D or 3D mode of vibration of the piezoelectric layer 112, are equally applicable to implementations in which the lateral distance, D, is generally in the X-Y plane but not necessarily along the X axis or the Y axis. By the same token, the X, Y, and Z axes in many of the disclosed implementations are illustrated with orientations generally along respective dimensions of the piezoelectric layer for reference purposes only. In some implementations, including those in which the piezoelectric layer 112 has an amorphous shape, a thickness can be defined as having a general orientation along a Z axis intersecting the upper and lower conductive layers, and a lateral plane generally perpendicular to the Z axis can be defined, with the lateral distance, D, situated in the lateral plane. In some examples, the lateral plane includes X and Y axes, which can have various orientations in the plane, and the lateral distance, D, can be aligned with or offset from the X and Y axes, depending on the desired frame of reference. For example, in some examples, a width of the piezoelectric layer can be generally oriented along the Y axis, while the length of the piezoelectric layer is generally oriented the X axis.

In FIG. 1, in some implementations, one or both of the conductive layers 104 and 108 cover a substantial portion of the surfaces on which the conductive layers are disposed. In the example of FIG. 1, the lower conductive layer 108 of one or more electrodes covers a substantial portion of the lower surface 120 of the piezoelectric layer 112, and the upper conductive layer 104 of one or more electrodes covers a substantial portion of the upper surface 116 of the piezoelectric layer 112. As illustrated in FIG. 1, more than about 50% of the surface area of a respective surface 116 or 120 is covered by a conductive layer, leaving less than about 50% of the surface area exposed. In some other examples, about 100% of the surface area of a respective surface 116 or 120 is covered by a conductive layer, for instance, having a single electrode, to maximize $kt^2$.

While the DMR structure 100 of FIG. 1 is a two-port resonator, that is, with an input signal delivered to an input terminal represented by upper conductive layer 104 and an output signal provided to an output terminal represented by lower conductive layer 108, the same 2D and 3D modes of vibration as described herein can be attained with one-port resonators. For instance, in an alternative example to that illustrated in FIG. 1, the lower conductive layer is coupled to ground, and the upper conductive layer serves as a signal terminal at which both the input signal is delivered and the output signal is sensed.

Figure 2:
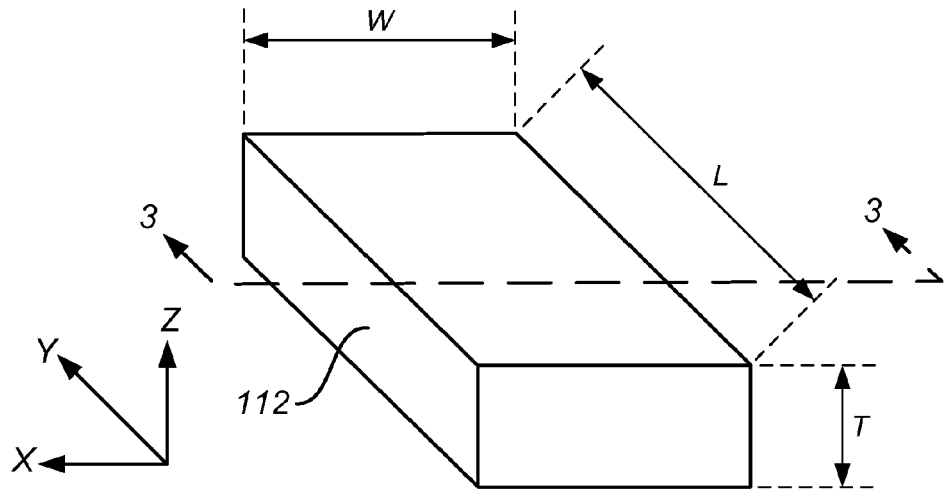
FIG. 2 shows an example of a perspective view of a piezoelectric layer of a DMR structure.

FIG. 2 shows an example of a perspective view of a piezoelectric layer of a DMR structure. In FIG. 2, the piezoelectric layer 112 has dimensions including a thickness, T, oriented along the Z axis, a width, W, oriented along the X axis, and length, L, oriented along the Y axis. The 2D or 3D modes of vibration, which can be attained with certain numerical ratios of T/D, can be based on a combination of coefficients of the piezoelectric material. Such coefficients can include the d31 coefficient generally associated with lateral motion of the piezoelectric layer 112 along its width and/or length, the d33 coefficient generally associated with vertical motion of the piezoelectric layer 112 along its thickness, the d32 coefficient (also associated with lateral motion but in a perpendicular direction with respect to d31 motion and within the same X-Y plane as d31 motion), the d24 coefficient (associated with shear displacement in response to an electrical field applied in the Y direction), and the d15 coefficient (associated with shear displacement in response to an electrical field applied in X direction).

Figure 3:
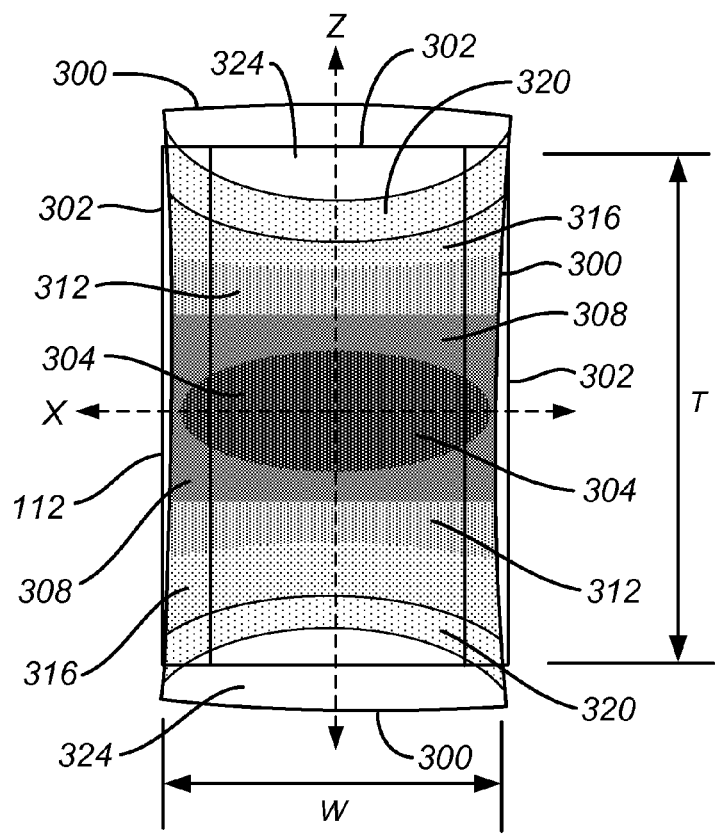
FIG. 3 shows an example of a geometric vibration mode shape in a cross-section of the piezoelectric layer of FIG. 2.

FIG. 3 shows an example of a geometric vibration mode shape in a cross-section of the piezoelectric layer of FIG. 2. In particular, FIG. 3 shows a front cross-sectional view of the piezoelectric layer 112 taken along lines 3-3 of FIG. 2. For purposes of illustrating a 2D dilation mode shape 300, in FIG. 3, the rectangular shape 302 indicates the cross-sectional shape of the piezoelectric layer 112 before excitation and deformation. In FIG. 3, the Z axis bisects the piezoelectric layer 112 along its width, and the X axis bisects the piezoelectric layer 112 along its thickness. In this example, the illustrated 2D dilation mode shape 300 can be achieved with a range of numerical ratios of the thickness and the width, T/W, with displacement along the Z axis and along the X axis. In other examples, a similar 2D dilation mode shape in a cross-section of the piezoelectric layer 112 along the Z axis and along the Y axis of FIG. 2 can be achieved with a range of numerical ratios of the thickness and the length, T/L, of the piezoelectric layer 112. While the cross-sectional shape of the piezoelectric layer 112 before deformation is rectangular in this example, it also can be square, circular and other polygonal shapes.

In the example of FIG. 3, the displacement of the piezoelectric material in piezoelectric layer 112 varies, depending on the location within the illustrated cross-section. For instance, in a first region 304 of the cross-section of the piezoelectric layer 112, including the intersection of the illustrated X and Z axes, there is little or zero displacement. In a second region 308 of the piezoelectric layer 112, there is little to medium displacement, that is, generally more displacement than in region 304. The amount of displacement continues to increase moving away from the intersection of the X and Z axes into further regions 312, 316 and 320 with maximum displacement occurring in regions 324. The displacement of piezoelectric layer 112 is such that the illustrated 2D mode has a symmetrical shape with respect to the Z axis. In this example, the displacement is also symmetrical with respect to the X axis. However, the displacement in the thickness direction (i.e., Z direction in this example) is generally not uniform, because the amount of displacement in the Z direction changes along the X axis. By the same token, displacement in the width direction (i.e., X direction in this example) is generally not uniform, because the amount of displacement in the X direction changes along the Z axis. In this example, the displacement in the 2D cross-section has strong components in the X and Z directions, contributing to the non-uniform shape along the Z and X axes, and providing desirably high electromechanical coupling.

Figure 4A:
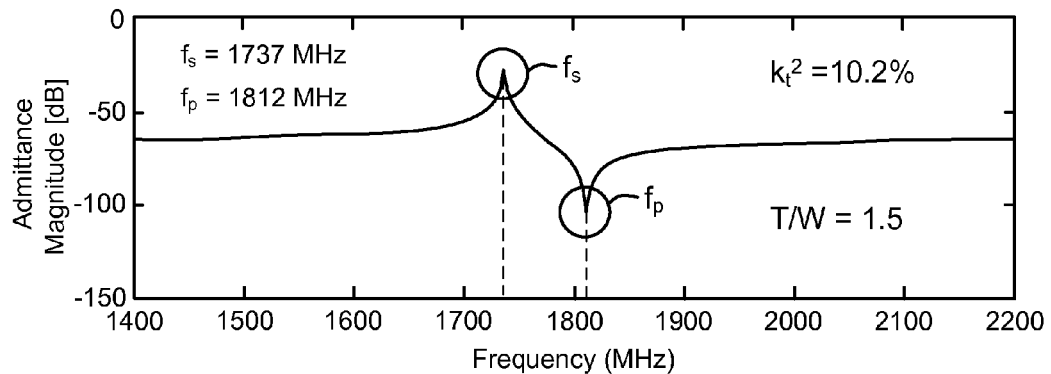
FIG. 4A shows a graph of the admittance in relation to the frequency of an input AC signal provided to an example of a DMR structure.

FIG. 4A shows a graph of the admittance in relation to the frequency of an input AC signal provided to an example of a DMR structure. In FIG. 4A, the resonant frequency of the structure occurs between frequencies fs, 1737 MHz in this example, and fp, 1812 MHz in this example. As illustrated in FIG. 4A, fs is the series resonant frequency, and fp is the parallel resonant frequency. The $kt^2$ value would ordinarily be approximated by the equation $kt^2=\pi^2/4*(fp-fs)/fp$, which is about 10.2%. A person having ordinary skill in the art will readily recognize that in some other implementations, the $kt^2$ value can be approximated by other known equations.

Figure 4B:
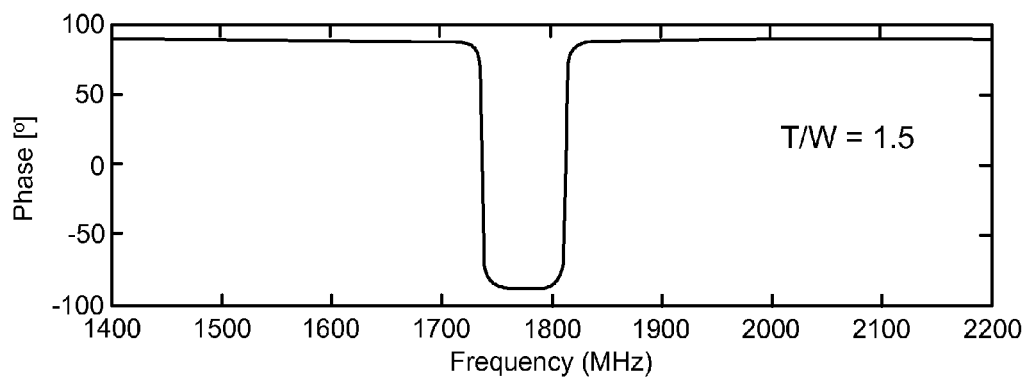
FIG. 4B shows a graph of the phase in relation to the frequency of the input AC signal provided to the example of the DMR structure of FIG. 4A.

FIG. 4B shows a graph of the phase in relation to the frequency of the input AC signal provided to the example of the DMR structure of FIG. 4A. Between fs and fp, the phase drops from about 90 degrees to about −90 degrees, which can cause the resonator to exhibit inductive characteristics. Outside the fs to fp region, the resonator can exhibit capacitive characteristics in its electrical response. The example graph (i.e., the admittance plot showing both magnitude and phase) depicted in FIG. 4B can be obtained by simulation for a DMR case where T/W=1.5.

Figure 5:
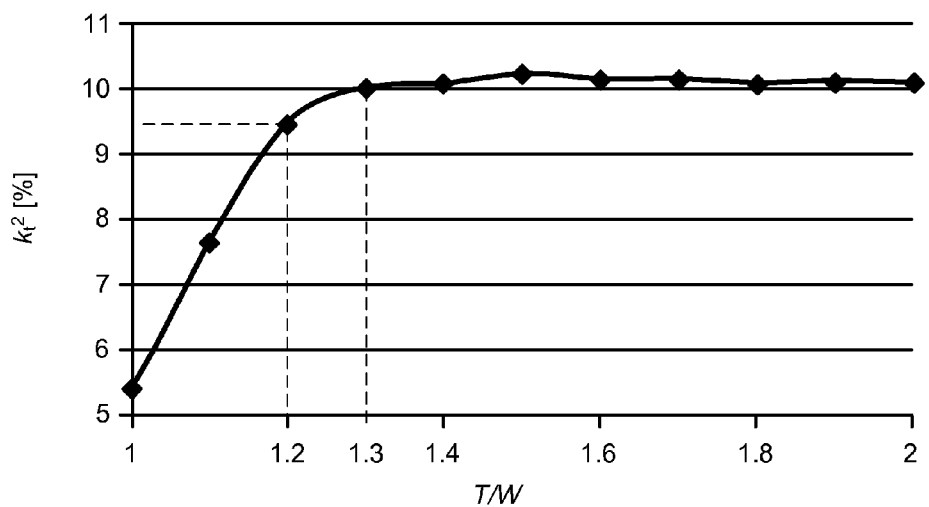
FIG. 5 shows a graph of an electromechanical coupling coefficient ($k_t^2$) in relation to a thickness/width ratio of an example of a DMR structure.

FIG. 5 shows a graph of an electromechanical coupling coefficient ($k_t^2$) value in relation to a thickness/width ratio of an example of a DMR structure. In the example of FIG. 5, the piezoelectric layer is formed of AlN. In this example, the numerical ratio, T/W, is in a designated range of greater than about 1, as illustrated, to produce a $k_t^2$ value greater than 5%. In this example, the range of T/W values includes a first range between about 1 and about 1.3 associated with a first electromechanical coupling and a second range greater than about 1.3 associated with a second electromechanical coupling different from the first electromechanical coupling. The first electromechanical coupling includes a range of $k_t^2$ values between about 5.4% and about 10% that are variable in relation to the numerical ratio, T/W, in the first range. In this example, $k_t^2$ increases in substantially linear fashion between about 5.4% and about 9.5% as T/W increases from about 1 to about 1.2. The $k_t^2$ value has a sloped shape between T/W values of about 1.2 and about 1.3. The second electromechanical coupling has a generally consistent $k_t^2$ value of about 10.2% for T/W ratios greater than about 1.3. Thus, at T/W values above about 1.3, the corresponding $k_t^2$ value is generally higher than the $k_t^2$ value corresponding to T/W values between about 1 and about 1.3. Those of ordinary skill in the art should appreciate that the $k_t^2$ values in the various T/W ranges illustrated in FIG. 5 are provided only as examples. Other $k_t^2$ values can be obtained in other numerical T/W ranges than those shown in FIG. 5.

In the example of FIG. 5, when T/W is between about 1 and about 1.3, the resonant frequency of the resonator structure is partially determined by lateral dimensions, i.e., width or length, of the piezoelectric layer. The electromechanical coupling is variable in relation to the numerical ratio, T/W, as explained above. Thus, the electromechanical coupling can be based on and controlled by the T/W ratio in this range. In FIG. 5, when T/W is greater than about 1.3, and $kt^2$ saturates to over 10%, the resonant frequency of the DMR is primarily determined by its thickness dimension, T. When T/W is smaller than about 1.0, the resonant frequency is primarily determined by its width dimension, W. In implementations in which T/W is smaller than about 1.0, the DMR may exhibit behavior similar to a contour mode resonator. In FIG. 5, a desirably high $kt^2$ value is achieved in both T/W regions, that is, above about 1, and above about 1.3, because the 2D cross-sectional mode shape, for instance, as described above with reference to FIG. 3, combines both the d33 and d31 piezoelectric coefficients.

Figure 6A:
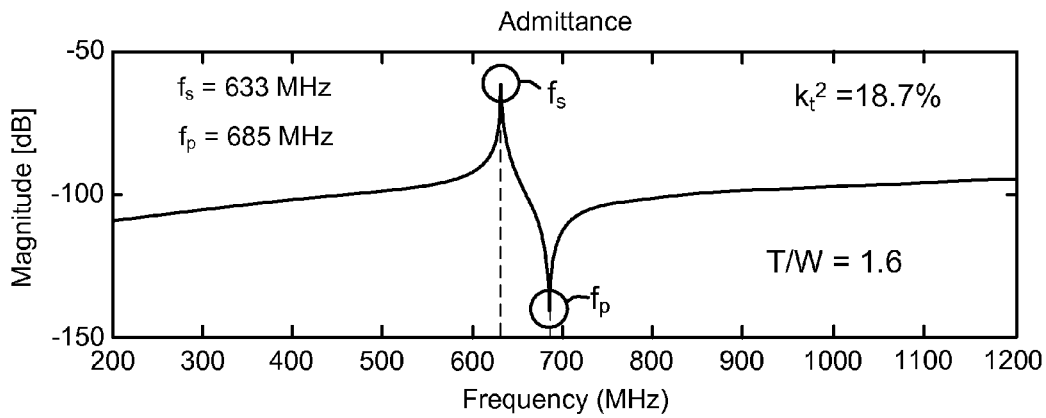
FIG. 6A shows a graph of the admittance in relation to the frequency of an input AC signal provided to an example of a DMR structure.

FIG. 6A shows a graph of the admittance in relation to the frequency of an input AC signal provided to an example of a DMR structure. In this example, the T/W ratio of the dimensions of a piezoelectric layer is approximately 1.6. The piezoelectric layer is formed of ZnO, in this example. In FIG. 6A, the resonant frequency of the structure occurs between frequencies fs, 633 MHz in this example, and fp, 685 MHz in this example. The resulting $kt^2$ value is approximately 18.7%, based on the aforementioned equation.

Figure 6B:
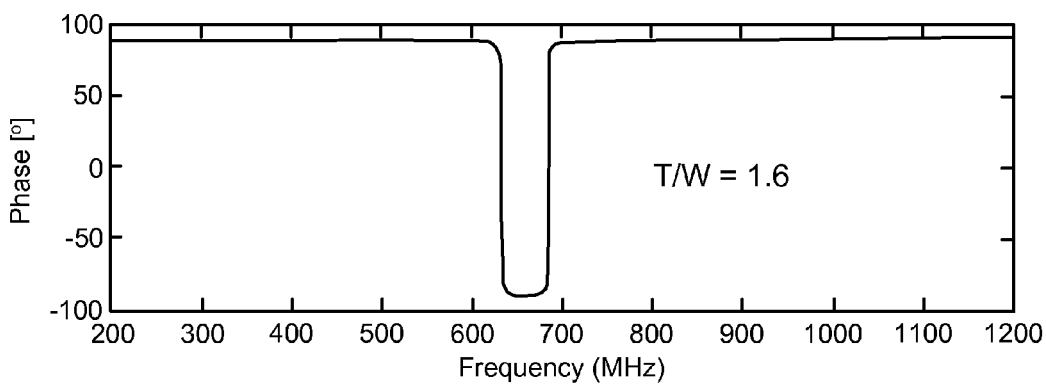
FIG. 6B shows a graph of the phase in relation to the frequency of the input AC signal provided to the example of the DMR structure of FIG. 6A.

FIG. 6B shows a graph of the phase in relation to the frequency of the input AC signal provided to the example of the DMR structure of FIG. 6A. Between fs and fp, the phase drops from about 90 degrees to about −90 degrees, which can cause the resonator to exhibit inductive characteristics. Outside the fs to fp region, the resonator can exhibit capacitive characteristics in its electrical response. The example graph (i.e., the admittance plot showing both magnitude and phase) depicted in FIG. 6B can be obtained by simulation for a DMR case where T/W=1.6, in this example.

Figure 7:
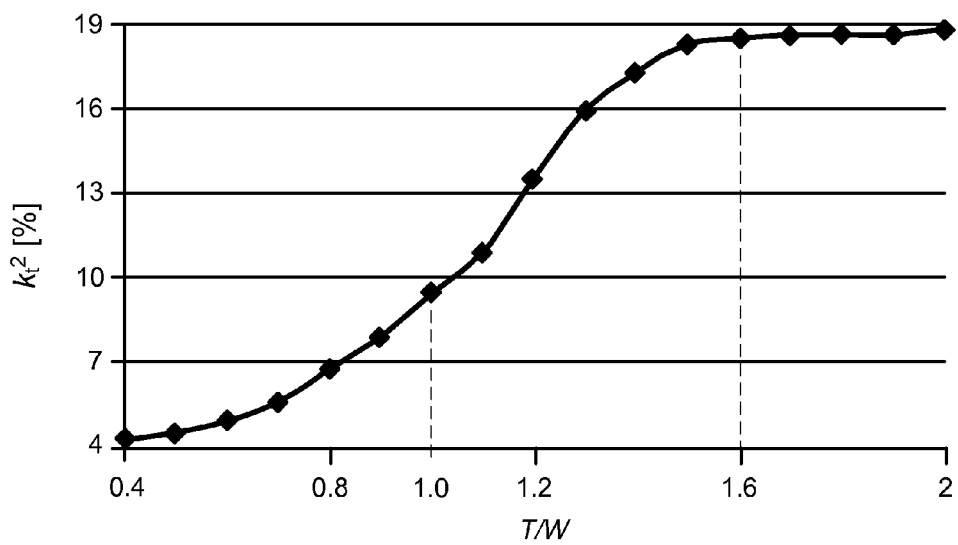
FIG. 7 shows another graph of an electromechanical coupling coefficient ($k_t^2$) in relation to a thickness/width ratio of an example of a DMR structure.

FIG. 7 shows a graph of an electromechanical coupling coefficient ($k_t^2$) in relation to a thickness/width ratio of an example of a DMR structure. In the example of FIG. 7, the piezoelectric layer is again formed of ZnO. In this example, the numerical ratio, T/W, is in a designated range of greater than about 0.4, as illustrated. In this example, the range of T/W values includes a first range between about 0.4 and about 1.0 associated with a first electromechanical coupling, a second range between about 1.0 and 1.6 associated with a second electromechanical coupling, and a third range greater than about 1.6 associated with a third electromechanical coupling.

The first, second and third electromechanical couplings are different from one another. The first electromechanical coupling includes a range of $k_t^2$ values between about 4.1% and about 9.9% that are variable in relation to the numerical ratio, T/W, in the first range. In this example, $k_t^2$ increases as T/W increases from about 0.4 to about 1.0. The second electromechanical coupling includes a range of $k_t^2$ values between about 9.9% and about 18% that are variable in relation to the numerical ratio, T/W, in the second range. In this example, $k_t^2$ increases as T/W increases from about 1.0 to about 1.6. The third electromechanical coupling has a generally consistent $k_t^2$ value of about 18.7% for T/W ratios greater than about 1.6. Thus, at T/W values above about 1.6, the corresponding $k_t^2$ value is generally higher than in the first and second ranges of T/W.

Thus, with ZnO as the piezoelectric material, even higher electromechanical coupling can be achieved than with AlN, in some examples. The disclosed cross-sectional dilation mode resonator configurations apply to other various kinds of piezoelectric materials to enhance electromechanical coupling. Such materials can include lead zirconate titanate (PZT), lithium niobate (LiNbO$_3$), and other piezoelectric materials described herein.

Figure 8:
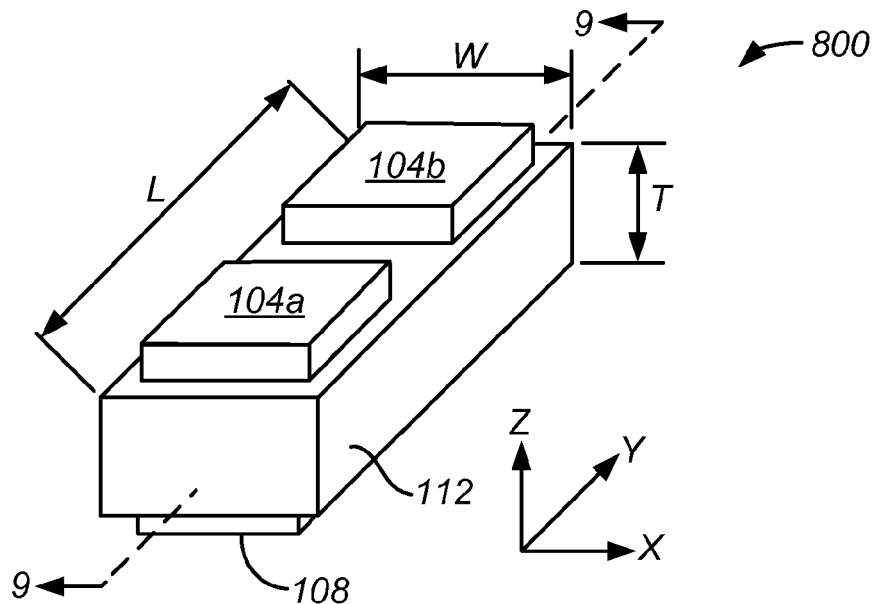
FIG. 8 shows an example of a perspective view of a DMR structure.

FIG. 8 shows an example of a perspective view of a DMR structure. In FIG. 8, the structure 800 includes an upper conductive layer of electrodes 104a and 104b. While only two electrodes are shown in this example, upper conductive layer 104 may include additional electrodes, depending on the desired implementation. In the example of FIG. 8, the electrodes 104a and 104b are spaced apart from one another and generally disposed along the length of the structure, i.e., along the Y axis. The structure 800 also includes a lower conductive layer 108 offset from the upper electrodes 104a and 104b along the Z axis, and a sandwiched piezoelectric layer 112 as described above. In FIG. 8, the piezoelectric layer 112 has dimensions W, L, and T, oriented along respective X, Y, and Z axes as described above. In this example, substantially all of the width of the piezoelectric layer 112 is covered by conductive material of the upper and lower conductive layers, excluding any gaps between electrodes along the length of the structure.

Figure 9A:
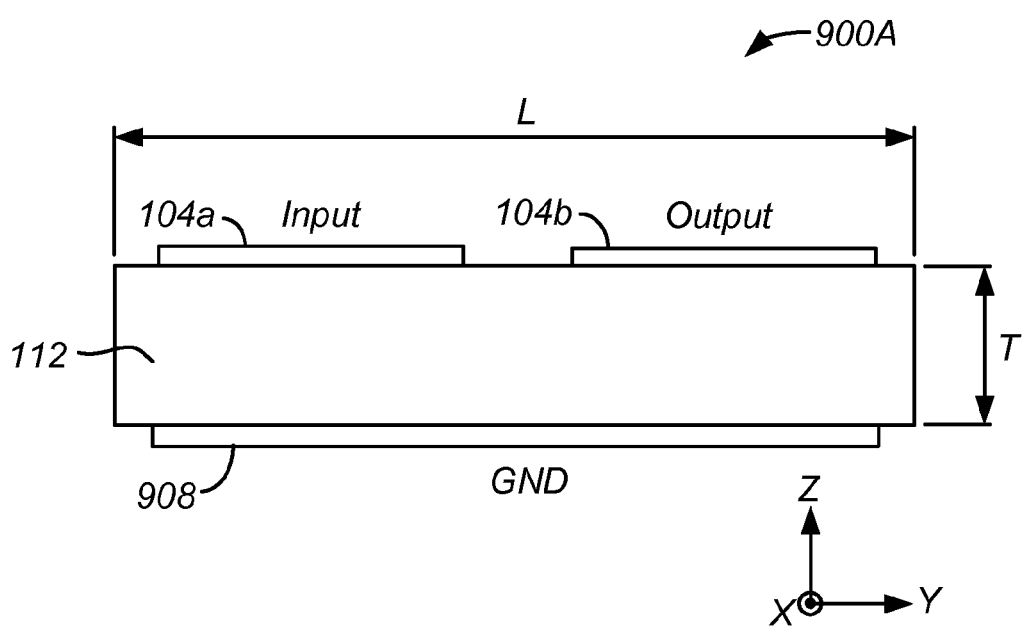
FIG. 9A shows an example of a cross-sectional view of a two-port DMR structure.

FIG. 9A shows an example of a cross-sectional view of a two-port DMR structure. In particular, the DMR structure 900A is illustrated as a cross-sectional view of one implementation of the structure shown in FIG. 8, taken along lines 9-9 of FIG. 8. In the example of FIG. 9A, the electrodes 104a and 104b of the upper conductive layer are generally disposed along the length of the structure, i.e., along the Y axis, as described above. In this example, electrode 104a is coupled to an input port, while electrode 104b is coupled to an output port. In this example, lower conductive layer 108 of FIG. 8 is implemented as one or more electrodes 908 coupled to ground. A numerical ratio of the thickness and a lateral distance, T/D, can be configured to provide a 2D mode of vibration of the piezoelectric layer 112 with displacement along the Z axis and along the X axis, or along the Z axis and along the Y axis, responsive to a signal provided to input electrode 104a. In some other implementations, a 3D mode of vibration is achieved with a numerical ratio of the thickness to the width and a numerical ratio of the thickness to the length, and includes displacement along the Z axis in combination with the X axis, and along the Z axis in combination with the Y axis. For example, an input AC signal having a frequency causing the structure 900A to vibrate at a resonant frequency can be provided to input electrode 104a, and a resulting output signal having the resonant frequency can be sensed at output electrode 104b.

Figure 9B:
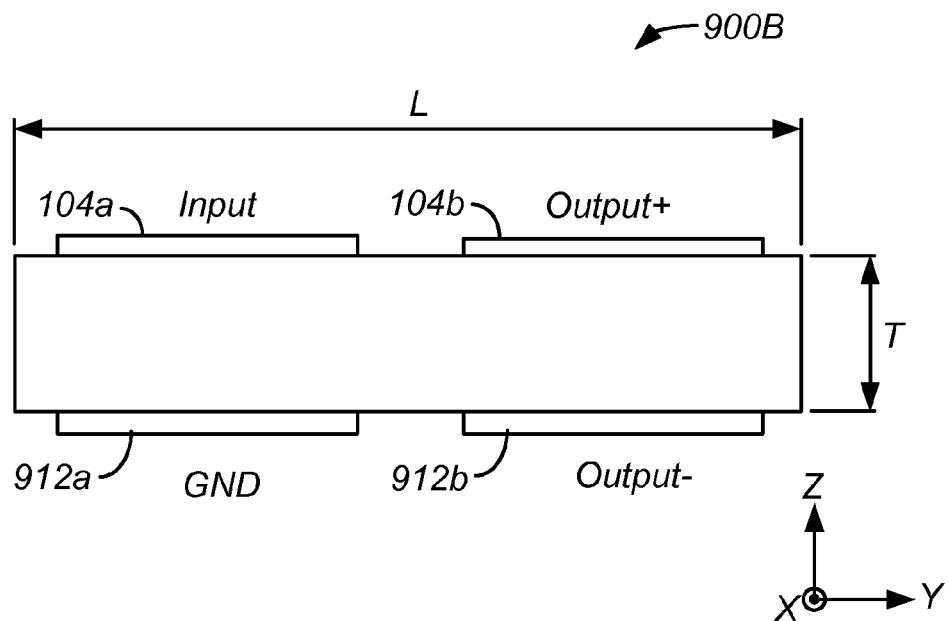
FIG. 9B shows an example of a cross-sectional view of a three-port DMR structure.

FIG. 9B shows an example of a cross-sectional view of a three-port DMR structure. The DMR structure 900B is illustrated as a cross-sectional view of one implementation of the structure shown in FIG. 8, taken along lines 9-9 of FIG. 8. In this example, electrode 104a is coupled to an input port, while electrode 104b is coupled to a first output port (Output+). In this example, lower conductive layer 108 is implemented as two electrodes, with a first electrode 912a coupled to ground and a second electrode 912b coupled to a second output port (Output−). 2D or 3D modes of vibration can be achieved, as described above, responsive to a signal provided to input electrode 104a. An input AC signal having a frequency causing the structure 900B to vibrate at a resonant frequency can be provided to input electrode 104a, and a resulting output signal having the resonant frequency can be sensed at output electrodes 104b and 912b. In some instances, a differential output signal can be generated by resonator structure 900B responsive to the input AC signal, with a first differential output at electrode 104b and a second differential output at electrode 912b.

Figure 9C:
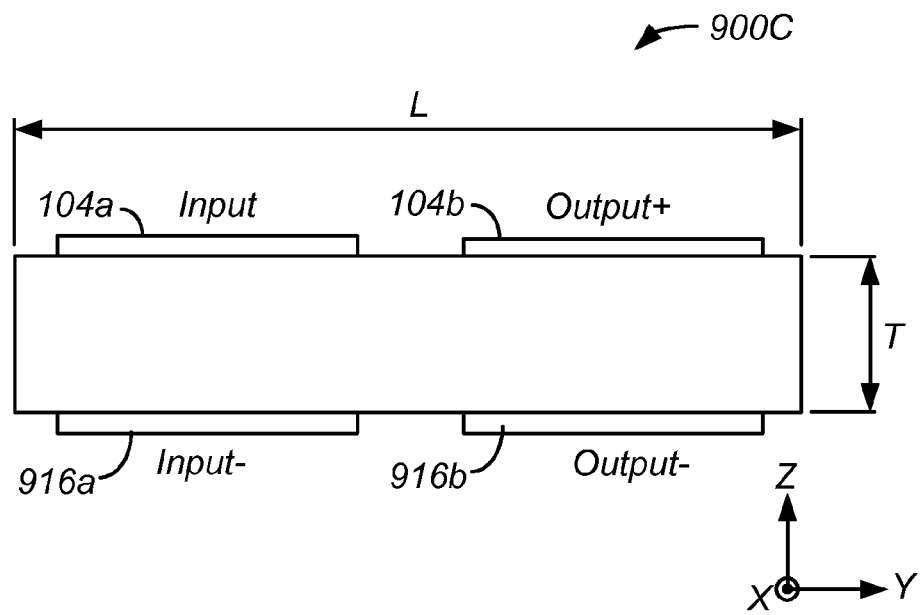
FIG. 9C shows an example of a cross-sectional view of a four-port DMR structure.

FIG. 9C shows an example of a cross-sectional view of a four-port DMR structure. The DMR structure 900C is illustrated as a cross-sectional view of one implementation of the structure shown in FIG. 8, taken along lines 9-9 of FIG. 8. In this example, electrode 104a is coupled to a first input port (Input+), while electrode 104b is coupled to a first output port (Output+). In this example, lower conductive layer 108 is implemented as two electrodes, with a first electrode 916a coupled to a second input port (Input−) and a second electrode 916b coupled to a second output port (Output−). 2D or 3D modes of vibration can be achieved, as described above, responsive to an input signal. For instance, a differential AC signal having a frequency causing the structure 900C to vibrate at a resonant frequency can be provided to input electrodes 104a and 916a, and a resulting differential output signal having the resonant frequency can be sensed at output electrodes 104b and 916b.

Figure 10A:
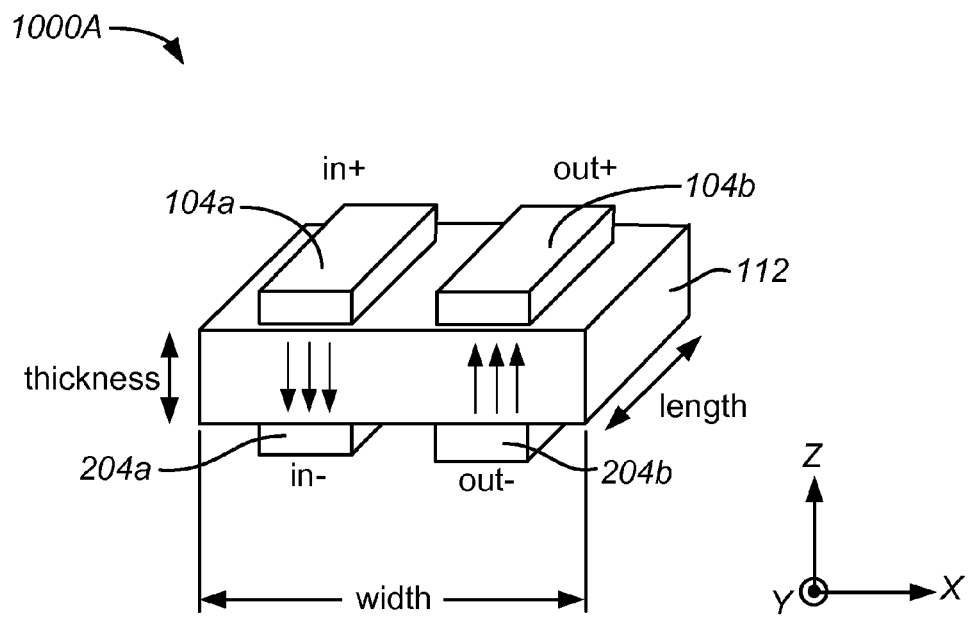
FIGS. 10A and 10B show examples of perspective views of four-port DMR structures.
Figure 10B:
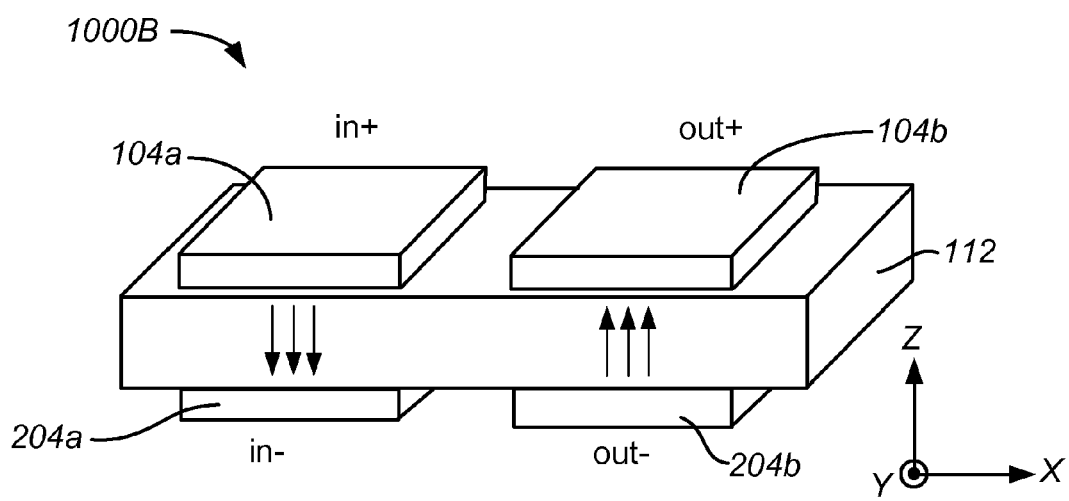

FIGS. 10A and 10B show examples of perspective views of four-port DMR structures. In FIGS. 10A and 10B, the DMRs 1000A and 1000B generally include an upper conductive layer and a lower conductive layer, as described above, with a piezoelectric layer 112 disposed between the two conductive layers. In FIGS. 10A and 10B, the lower conductive layer includes one or more input electrodes 204a at which a first input signal, in−, is provided and one or more output electrodes 204b at which a first output signal, out−, is provided. The upper conductive layer includes one or more input electrodes 104a at which a second input signal in+ is provided. Here, as an alternative to the geometries of FIGS. 8 and 9A-9C, the electrodes of a given conductive layer are generally disposed along the width of the structure, i.e., along the X axis.

The input ports/electrodes of the various resonator structures and devices disclosed herein can be connected to the outputs of components which deliver signals to the resonator structure, such as an amplifier or an antenna output. In this way, when such input signals are provided to the input electrodes of the DMR, such as electrodes 104a and 204a of FIGS. 10A and 10B, an alternating electric field can be applied across the thickness of the piezoelectric layer 112, as illustrated in FIGS. 10A and 10B.

In FIGS. 10A and 10B, pairs of planar elongated electrodes are situated on opposite sides of the piezoelectric layer, where the electrodes have longitudinal axes oriented along a length of the device, substantially parallel with one another. The differential input electrodes are marked in+ and in−, and the differential output electrodes are marked out+ and out−.

When a differential input signal is applied to electrodes in+ and in−, a vertical electric field is induced across the piezoelectric layer 112 thickness, causing a 2D or 3D vibration mode in the piezoelectric layer, as described above. This mechanical energy is converted back to a differential electrical signal at the output electrodes out+ and out−.

Figure 11A:
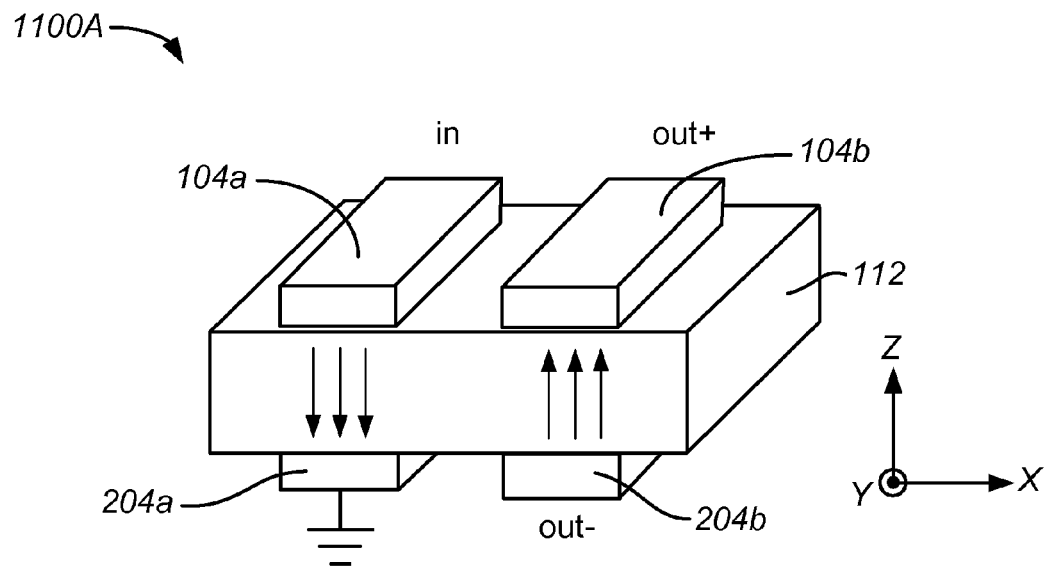
FIGS. 11A and 11B show examples of perspective views of three-port DMR structures.

The same DMR structures as described above can be implemented as a single-ended to differential filter. For instance, FIG. 11A shows an example of a perspective view of a three-port DMR structure. In FIG. 11A, DMR 1100A has a similar geometry and orientation with respect to the X, Y and Z axes as DMRs 1000 of FIGS. 10A and 10B. However, one difference between the structures is that the in− electrode(s) 204a of the DMR has been connected to ground. Thus, a single-ended input signal delivered to the remaining input electrode(s) 104a at the appropriate frequency can be converted to a differential signal at output electrode(s) 104b (out+) and 204b (out−). In this single-ended to differential configuration, input electrodes 204a or 104a can be connected to ground via tethers as described above. Separate sets of tethers can be used to route the input electrical signal and differential output electrical signals.

Figure 11B:
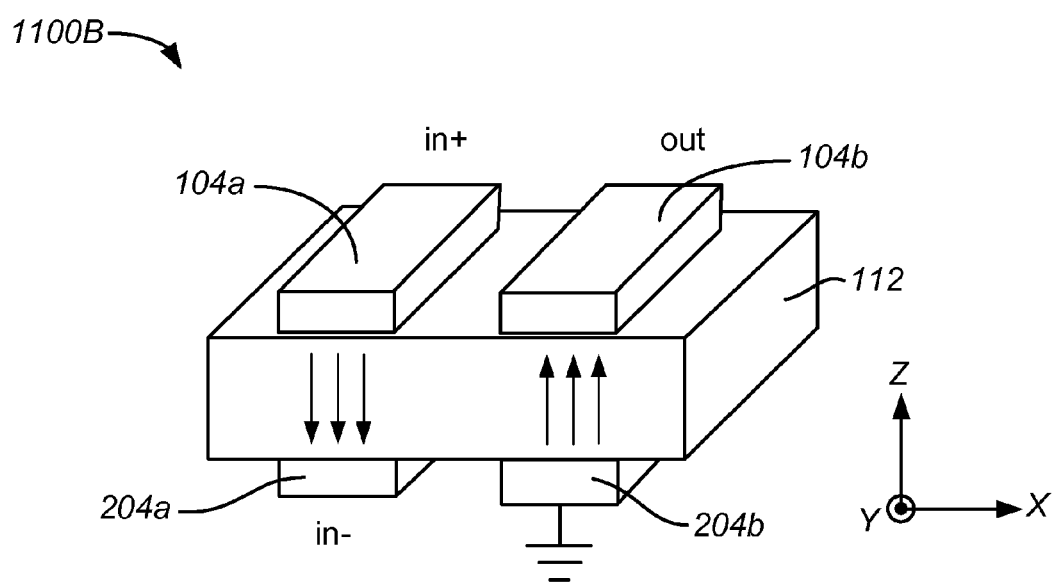

A differential to single-ended system can be constructed, again using the same DMR structures as disclosed herein, by connecting one of the output ports to ground, while leaving the input ports as differential inputs. FIG. 11B shows an example of a perspective view of a three-port DMR structure. In FIG. 11B, a differential signal delivered to differential input electrodes 104a and 204a is converted to a single-ended output signal at electrode(s) 104b. Here, electrode(s) 204b, has been connected to ground.

DMRs constructed in accordance with some of the implementations herein can be configured to provide multiple resonant frequencies. Any number of DMR structures can be connected in parallel, for example, in the implementations described below. Such DMRs can be fabricated on the same glass substrate. The present implementations of DMRs can be employed in RF wireless communications as frequency reference elements or arranged in arrays to form banks of multi-frequency filters.

Figure 12A:
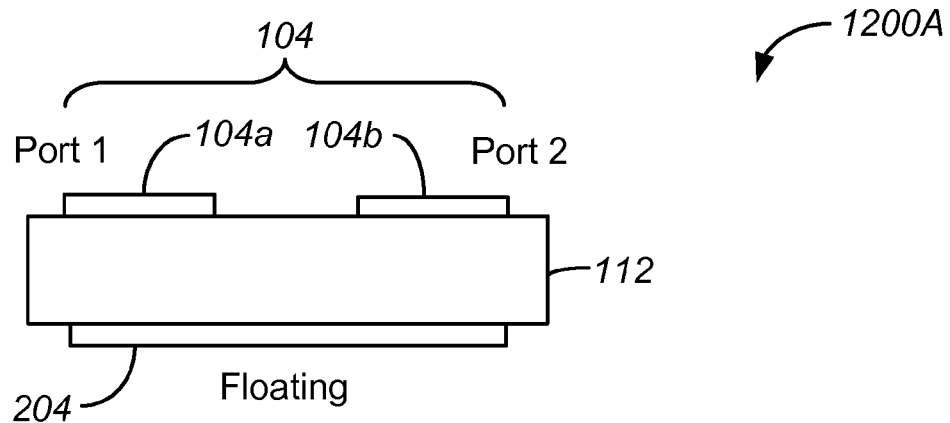
FIGS. 12A-12C show examples of side views of DMR structures.
Figure 12B:
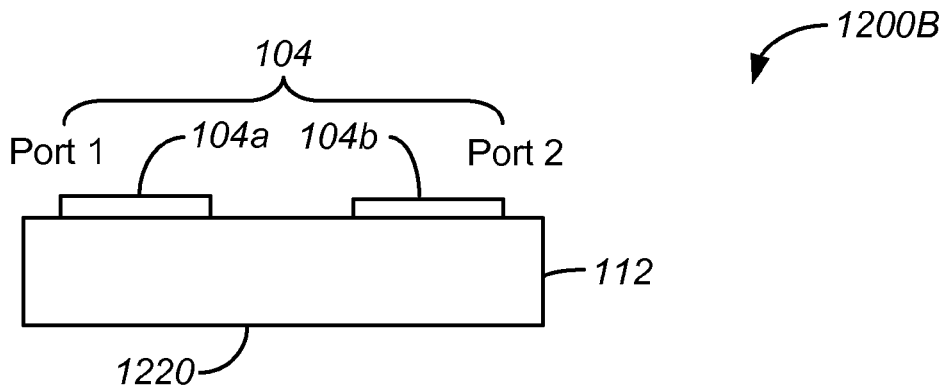
Figure 12C:
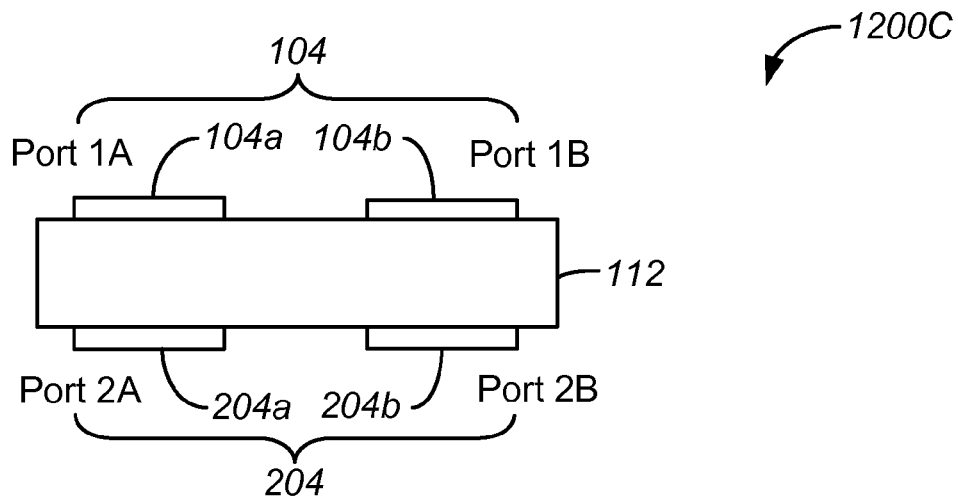

The disclosed implementations also include DMR structures and configurations in which there are no ground connections. Such examples often address one side of the piezoelectric layer, in particular, on the opposite side of a conductive layer having one or more electrodes. These examples include configurations in which there are no ground connections on the surface of a piezoelectric layer opposite a conductive layer of input and output electrode(s). In one floating configuration, as shown in FIG. 12A, an upper conductive layer on an upper side of a piezoelectric layer includes an input electrode and an output electrode, while a lower conductive layer on the lower side of the piezoelectric layer (opposite the upper conductive layer) is floating. In another configuration, as shown in FIG. 12B, there is no lower conductive layer, thus exposing the lower side of the piezoelectric layer. The exposed lower side has no electrical connections. In yet another example, as shown in the configuration of FIG. 12C, the lower conductive layer includes an additional input electrode and output electrode and, as with the examples of FIGS. 12A and 12B, has no ground connections.

FIG. 12A shows an example of a side view of a resonator structure. The resonator structure 1200A has an upper conductive layer 104 including a first electrode 104a connected to Port 1, at which an input signal can be delivered, and a second electrode 104b connected to Port 2, at which an output signal can be provided, by way of example. Ports 1 and 2 can be reversed so the input signal is delivered to the second electrode 104b and resulting output signal is sensed at the first electrode 104a, depending on the desired implementation. In this example, a piezoelectric layer 112 is abutting the upper conductive layer 104. As described above, an input electrical signal at Port 1 can cause the piezoelectric layer 112 to mechanically vibrate at a resonant frequency, which translates to an output electrical signal at Port 2.

In the "floating" implementation of FIG. 12A, a lower conductive layer 204 including one or more electrodes is floating and unbiased; that is, it has no ground connections and is otherwise electrically isolated from electrical connections and components external to the resonator structure 1200A. For instance, in the implementation of FIG. 12A, the floating lower conductive layer 204 would be electrically disconnected from ground as well as any electronic power sources and circuits.

FIG. 12B shows an example of a side view of a resonator structure. The resonator structure 1200B has a similar arrangement of layers as FIG. 12A, with like reference numerals indicating like parts. In the implementation of FIG. 12B, however, there is no lower conductive layer, thus exposing the lower surface 1220 of the piezoelectric layer 112. In this example, the lower surface 1220 is floating and unbiased, as described above with respect to the lower conductive layer of FIG. 12A.

FIG. 12C shows an example of a side view of a resonator structure. The resonator structure 1200C has a similar arrangement of layers as FIG. 12A, with like reference numerals indicating like parts. In this implementation, the lower conductive layer 204 includes a first electrode 204a and a second electrode 204b. Again, the lower conductive layer 204 has no ground connections.

In FIG. 12C, the resonator structure 1200C is configured for additional signaling, in which the separate electrodes 204a and 204b of the lower conductive layer 204 can cooperate with the electrodes 104a and 104b of the upper conductive layer 104. Pairs of electrodes can be connected, for example, such that Port 1A and Port 2A are coupled to the output of an electrical component such as an amplifier or antenna to receive the same input signal, and a resulting output electrical signal can be sensed at Port 1B and/or Port 2B. In another example, Port 1A and Port 2B are coupled to receive the same input signal, and a resulting output signal can be sensed at Port 1B and/or Port 2A.

Other configurations are contemplated within the scope of this disclosure. In one configuration of FIG. 12C, one electrode 104a or 104b can be connected to receive an input signal, and another electrode 204a or 204b can provide an output signal, while the other electrodes are floating. In another configuration of FIG. 12C, one electrode 104a or 204a can be connected to receive the electrical input signal, and another electrode 104b or 204b can provide an output signal, while the other electrodes are floating. In these various configurations, none of Ports 1A, 1B, 2A and 2B are connected to ground.

Figure 13:
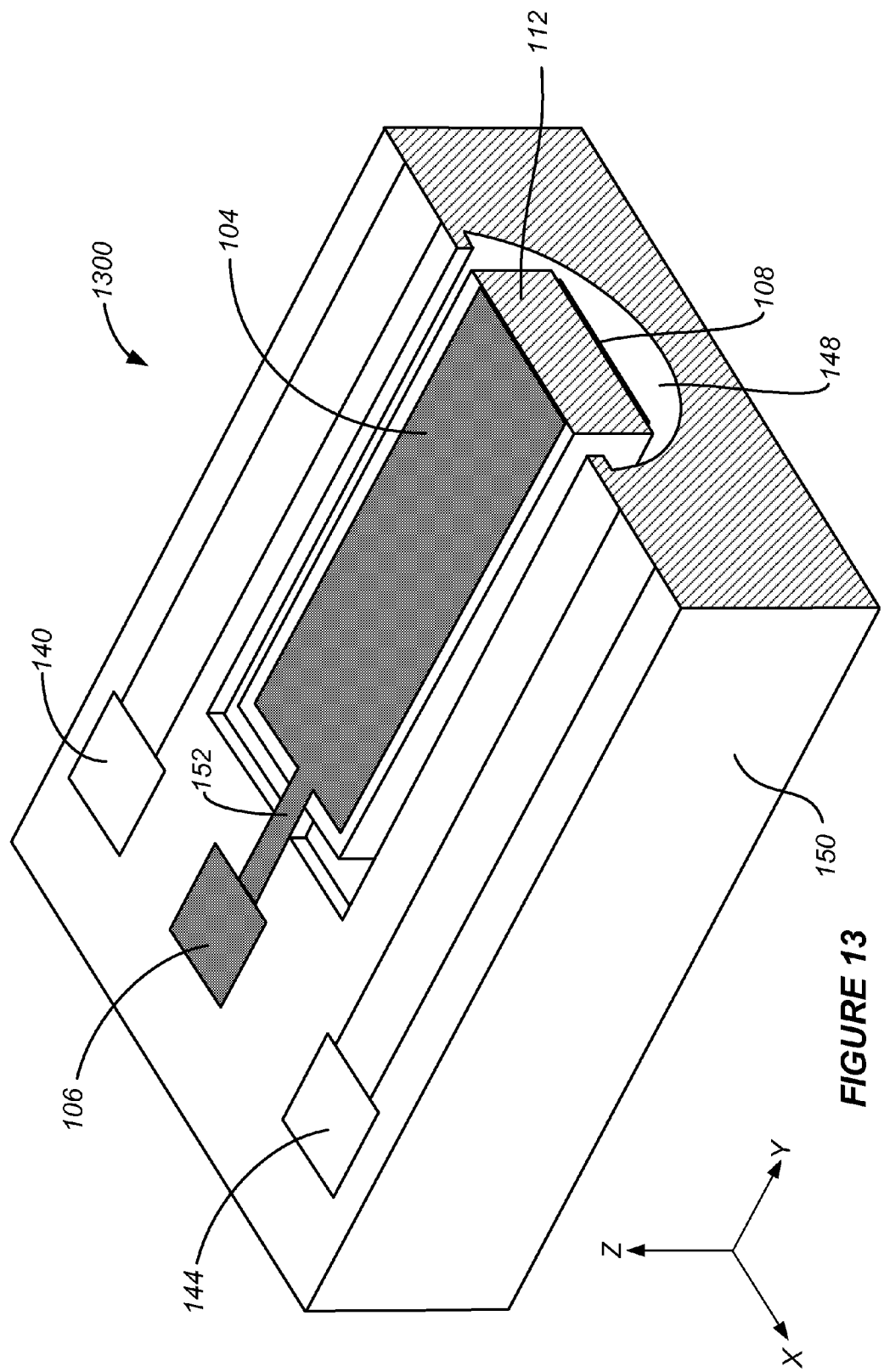
FIG. 13 shows an example of a perspective cut-away view of a DMR device.

FIG. 13 shows an example of a perspective cut-away view of a DMR device. In FIG. 13, a DMR structure 1300 includes an upper conductive layer 104 connected to an input port 106. A lower conductive layer 108 is situated underneath the upper conductive layer 104 on the opposite side of a sandwiched piezoelectric layer 112, as described herein. The lower conductive layer 108 can be coupled to an output port (not shown). The upper and lower conductive layers can each have arrangements of one or more electrodes, as described in the various implementations herein.

In FIG. 13, the output port can be coupled to ground terminal 140 and/or ground terminal 144, thus grounding the lower conductive layer 108, while an input electrical signal can be provided to input port 106. An output electrical signal also can be sensed at input port 106.

In FIG. 13, the DMR structure 1300 is suspended in a cavity 148 formed in a supporting structure 150 by virtue of a tether 152, as well as a matching tether (not shown) connected at the opposite end of the DMR structure 1300 from the tether 152. In FIG. 13, the tethers serve as physical anchors to physically connect the DMR structure 1300 to the supporting structure 150 and hold the structure 1300 in the cavity 148. The DMR structure 1300 is capable of a 3D or 2D mode of vibration by virtue of vibration of the piezoelectric material, that is, with displacement along the both the Z axis and the X axis and/or the Y axis as described in greater detail herein. In this example, the tether 152 can be electrically and mechanically coupled between the upper conductive layer 104 and port 106, which is mounted on supporting structure 150. In this example, the matching tether on the opposite end of the DMR structure 1300 can similarly electrically and mechanically couple the lower conductive layer 108 to another port, similarly mounted on supporting structure 150. The tethers can be fabricated as extensions of their respective conductive layers and can be on the order of several microns wide, e.g., along the X axis. In some implementations, the tethers are designed such that their length, e.g., along the Y axis of FIG. 13, is an integer number of resonant quarter wavelengths. In other examples, tethers can be formed as extensions of the piezoelectric layer 112 to anchor the piezoelectric layer 112 to supporting structure 150.

The DMR structures herein can include a pattern of metal electrodes in the upper and lower conductive layers that, when provided one or more electrical input signals, causes the piezoelectric layer to have a motional response. The motional response can include a vibrational oscillation along one or more of the X, Y and Z axes. The resonant frequency of the DMR structure can be partially determined by the lateral dimension—width (W) and/or or length (L)—and the thickness dimension (T). In some implementations, one dimension may be dominant depending on the T/W, or T/L, ratio. In implementations where the resonant frequency is dominated by the lateral dimension, the resonant frequency response of the DMR structure can be controlled according to a periodic arrangement of electrodes in the conductive layers, for instance, by adjusting the width(s) as well as the spacing(s) of the electrodes from one another in a conductive layer, e.g., along the X axis of FIG. 1, as further explained herein.

Figure 14:
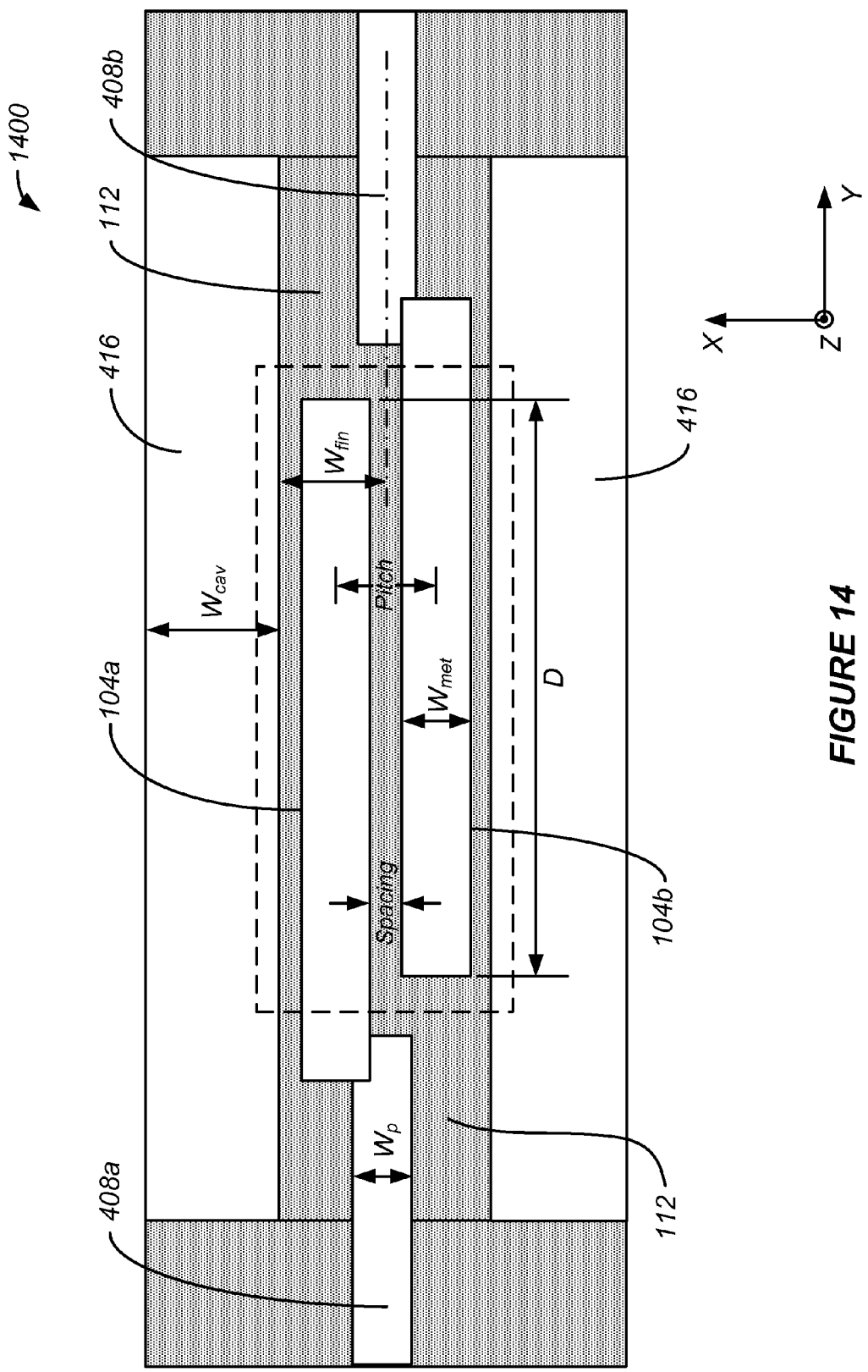
FIG. 14 shows an example of a top view of a DMR device.

FIG. 14 shows an example of a top view of a DMR device. In the implementation of FIG. 14, a resonator structure 1400 is configured as a DMR, with electrodes in the respective conductive layers having longitudinal axes substantially parallel to one another and extending along the Y axis, as illustrated. A resonator structure generally has a finger width, Wfin, representing the width of a sub-resonator, which primarily includes one electrode and half of the width of the exposed piezoelectric material on either side of the one electrode along the X axis, for example, as shown in FIG. 14. The electrode width, that is, the width of an individual electrode, Wmet, is generally smaller than the finger width, to limit the feed-through capacitance between electrodes. The pitch of the resonator structure generally refers to the distance between mid-points of electrodes along the X axis, as shown in FIG. 14. The spacing of electrodes refers to the gap between the edges of adjacent electrodes along the X axis, as shown in FIG. 14. The resonant frequency of the resonator structures disclosed herein can be primarily determined by the finger width or pitch, if properly designed depending on the T/W ratio, or alternatively the T/L ratio. More generally, the resonant frequency can be determined partially by the finger width or pitch and the thickness of the resonator. The electrode width and spacing have second-order effects on the frequency. The finger width and pitch are correlated with the electrode width and spacing parameters, by definition. Pitch is often equal to finger width, as shown in the example of FIG. 14.

In FIG. 14, in one example, the upper electrodes 104a and 104b have an electrode width along the X axis, Wmet, of 4.8 um. Connecting members 408a and 408b, which can include tethers in some examples, are coupled to the respective electrodes 104a and 104b. The connecting members 408a and 408b have a connecting member width, Wp, which can be smaller than Wmet in this example. In other instances, Wp is the same size or larger than Wmet, depending on the desired configuration. The finger width of the electrodes, Wfin, which corresponds to the half-width of the piezoelectric layer 112 in this example, is 6.4 um. Wcav, the cavity width of cavity 416 along the X axis can be an integer multiple of Wfin, such as 2*Wfin (e.g., 12.8 um) or other measurement. Thus, in this instance, Wcav is approximately the same as the full piezoelectric layer width. In this example, a distance D, in which the upper electrodes 104a and 104b are adjacent to one another, can be on the order of 128 um or 256 um, by way of example.

Figure 15:
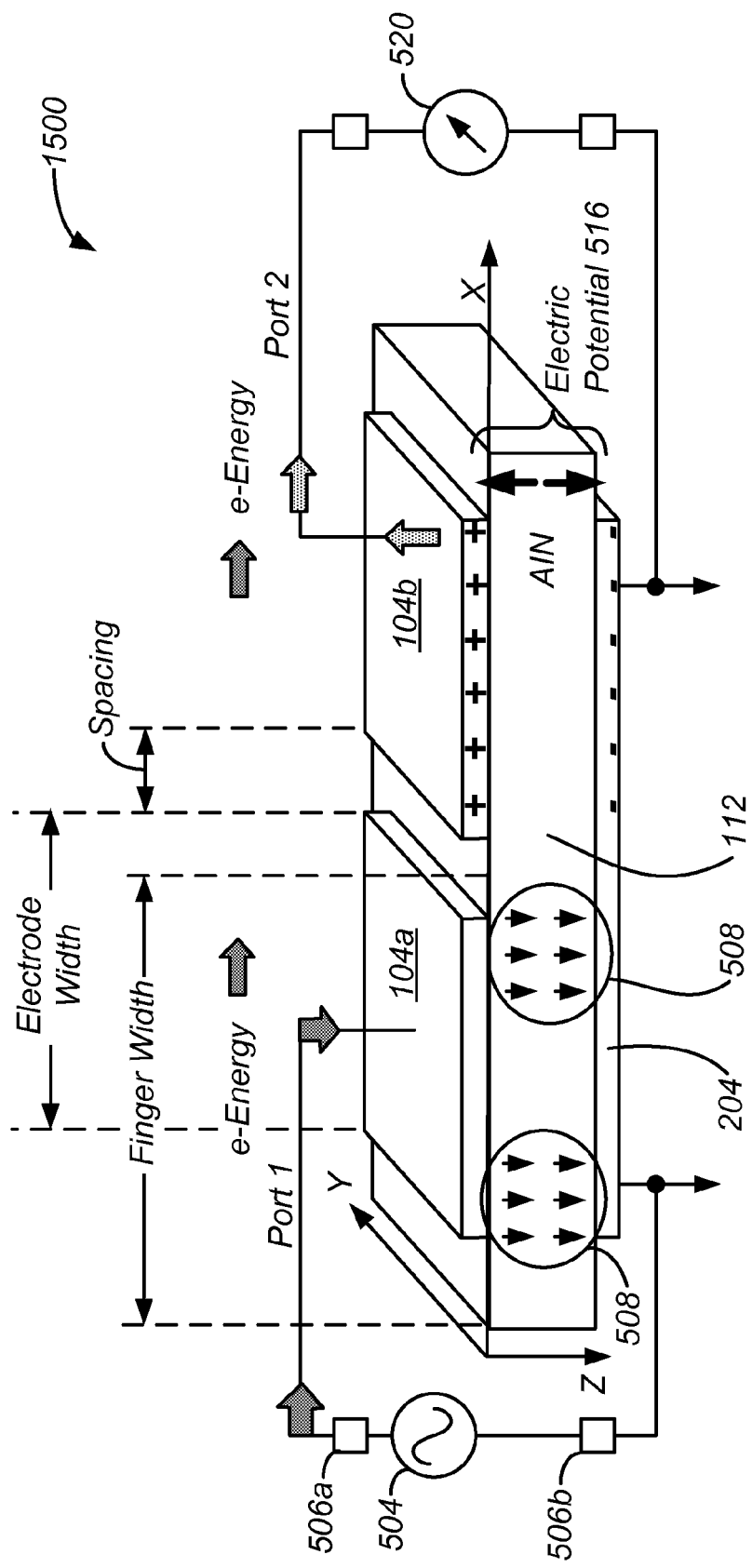
FIG. 15 shows an example of a perspective cross-sectional view of a DMR structure.

FIG. 15 shows an example of a perspective cross-sectional view of a DMR structure. In FIG. 15, the resonator structure 1500 includes an upper conductive layer of electrodes 104a and 104b, a piezoelectric layer 112, and a lower conductive layer in the form of a single electrode 204, with the layers stacked as described above. In FIG. 15, there is an input port, "Port 1," at which an input electrical signal can be delivered to first electrode 104a of the upper conductive layer. Port 1 can be coupled to receive the input electrical signal from various components, such as an amplifier or an antenna. In the illustration of FIG. 15, an alternating current (AC) voltage source 504 simulates the electrical signal delivered by such a component. The AC voltage source 504 has a first terminal 506a coupled to Port 1 and a second terminal 506b coupled to the lower electrode 204, which is coupled to ground in this example. In this way, an input AC signal can be provided from voltage source 504 to Port 1 and, hence, to first electrode 104a of the resonator. An electric field caused by the alternating voltage of the AC signal is applied across the thickness of the piezoelectric layer 112, illustrated by arrows 508 in FIG. 15.

The thickness is one dimension of the structure 1500 and is generally measured along the Z axis, whereas the length is measured along the Y axis, at least in the example of FIG. 15. The piezoelectric layer 112 may be thicker or thinner than as illustrated in FIG. 15, as well as FIG. 13, depending on the desired ratio of the thickness to the width or length, as described in the implementations herein. The total width, referring to the width of the overall structure 1500, as well as finger width, spacing, and electrode width are measured along the X axis, in the example of FIG. 15. The length of the structure 1500 and the width of the structure 1500 are examples of lateral distances of the resonator structure dimensions. The electric field 508 can be applied in a manner to transduce mechanical resonance such that piezoelectric layer 112 experiences displacement back and forth along one or more of the X, Y and Z axes. This includes a two-dimensional mode of vibration in a cross-section of the structure 1500 with displacement along the Z axis, corresponding to the thickness of the structure, and the X axis (corresponding to the width) and/or the Y axis (corresponding to the length) in FIG. 15. Because displacement is possible along the length and/or the width, depending on the desired configuration, it can generally be said that the 2D mode of vibration or the 3D mode of vibration includes displacement of the piezoelectric layer 112 along a plane of the X axis and the Y axis, in combination with displacement along the Z axis.

FIG. 15 illustrates a two-port structure with the second electrode 104b coupled to Port 2, which represents an output port in this configuration. The piezoelectric layer 112 of the disclosed resonators can be configured to vibrate and move in all dimensions at resonant frequencies, for instances, in planes oriented along the X and Y axes, X and Z axes, and Y and Z axes. In one example of a DMR, the electric field 508 is induced across piezoelectric layer 112 along the Z axis, causing extensional mechanical stress in the piezoelectric layer in a cross-section of the resonator structure 1500 along the thickness and the width of the structure through piezoelectric mechanical coupling. This mechanical energy causes an electric potential 516 to be generated across second electrode 104b and lower electrode 204. This transduced potential can be sensed as an output electrical signal at Port 2 and can be measured by one or more sensors 520 coupled between Port 2 and the grounded lower electrode 204.

The fundamental frequency for the displacement of the piezoelectric layer can be set in part lithographically by the planar dimensions of the upper electrodes, the lower electrode(s), and/or the piezoelectric layer. For instance, the resonator structures described above can be implemented by patterning the input electrodes and output electrodes of a respective conductive layer symmetrically. In some examples, an AC electric field applied across the upper and lower electrodes induces mechanical deformations in one or more planes of the piezoelectric layer via the d31 coefficient, the d32 coefficient, the d33 coefficient, the d24 coefficient, and/or the d15 coefficient of the piezoelectric material, such as AlN. At the device resonant frequency, the electrical signal across the device is reinforced and the device behaves as an electronic resonant circuit.

In some implementations, the resonant frequency of a DMR can be partially controlled by setting the finger width, as shown in FIG. 15. One benefit of such a control parameter is that multi-frequency filters can be fabricated on the same chip. The resonant frequency can be associated with the finger width, which is based on the spacing in combination with the electrode width of electrodes 104a and 104b, that is, along the X axis. The finger width of the structure 1500 can be altered to adjust the resonant frequency. For instance, the resonant frequency is generally lowered as the finger width increases, and vice versa.

The total width, length, and thickness of the resonator structure are parameters that also can be designated to optimize performance. In some DMR implementations, the finger width of the resonator is the main parameter that is controlled to adjust the resonant frequency of the structure, while the total width multiplied by the total length of the resonator (total area) can be set to control the impedance of the resonator structure. In one example, in FIG. 15, the width of resonator structure 1500 can be on the order of several micrometers, and the length in a range of about 1-100 micrometers for a device designed to operate around 1 GHz. Through testing and experimentation, when the parameters of the numerical ratio to produce the desired 2D or 3D mode of vibration of the resonator are the thickness and the width, the length can be set to minimize possible spurious modes at other frequencies. A suitable thickness of the piezoelectric layer can be about several micrometers and controlled with respect to the width to produce a desired thickness-to-width ratio, as explained in the examples below.

The passband frequency can be determined by the layout of the resonator structure, as can the termination impedance in terms of filter application using those DMRs. For instance, by changing the shape, size and number of electrodes, the termination impedance can be adjusted. In some examples, longer fingers along the Y axis yield smaller impedance. This, in turn, is inversely proportional to the capacitance of the DMR. The impedance and the frequency can be controlled independently, since the length and the width/spacing of electrodes are in perpendicular directions.

Figure 16:
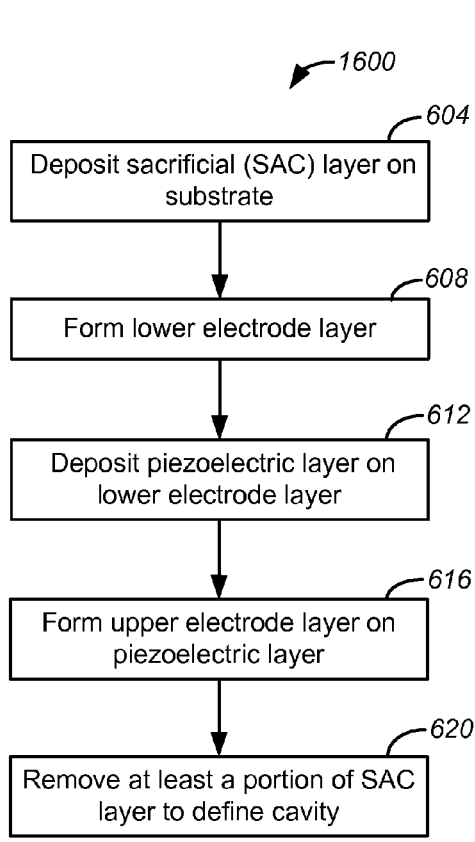
FIG. 16 shows an example of a flow diagram illustrating a process for forming a resonator structure.

FIG. 16 shows an example of a flow diagram illustrating a process for forming a resonator structure. In FIG. 16, the process 1600 begins in block 604 in which a sacrificial (SAC) layer is deposited on a substrate. The SAC layer can have various shapes and sizes, and can be shaped to cover all or some portion of the substrate, depending on the desired implementation. In block 608, a lower electrode layer is formed on the SAC layer. The lower electrode layer is made of a conductive material such as metal and can be patterned to define one or more electrodes, depending on the desired configuration. When more than one electrode is defined, the electrodes can be connected at separate ports of the resonator device. In block 612, a piezoelectric layer is deposited on the lower electrode layer. In block 616, an upper electrode layer is then formed on the piezoelectric layer. The upper electrode layer also can be patterned to define more than one electrode. In some implementations, overlaying groups of electrodes can be defined in the upper and lower electrode layers on opposite surfaces of the piezoelectric layer. In block 620, part or all of the SAC layer is removed to define a cavity beneath the resonator structure.

Figure 17:
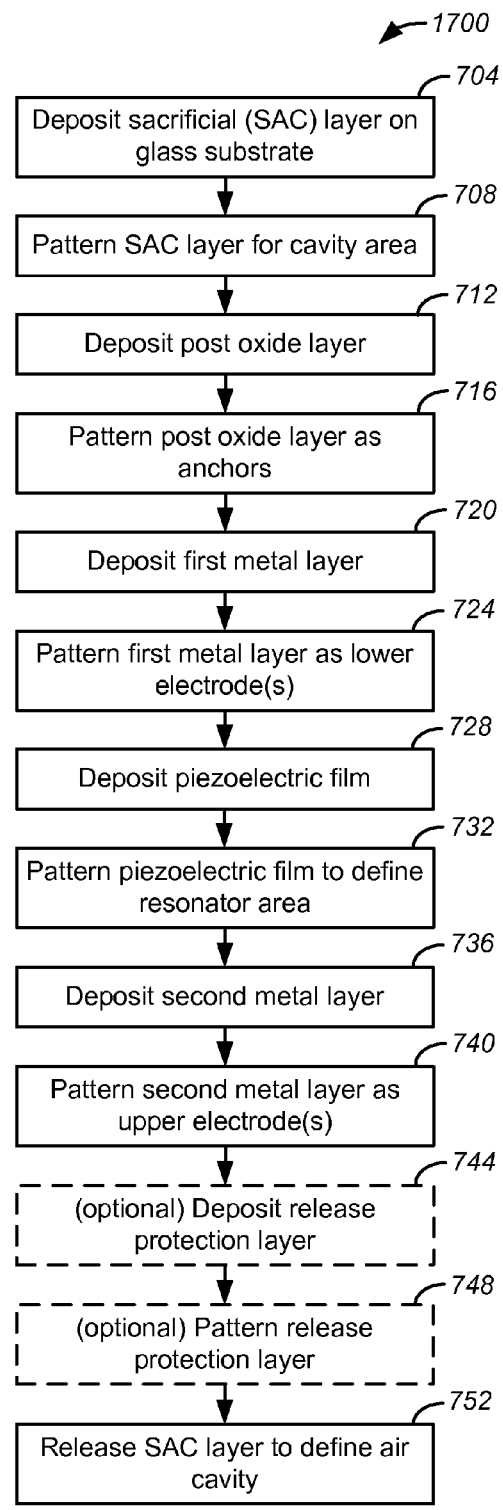
FIG. 17 shows an example of a flow diagram illustrating a process for forming a staggered resonator structure.

FIG. 17 shows an example of a flow diagram illustrating a process for forming a staggered resonator structure. FIGS. 18A-18G show examples of cross-sectional schematic illustrations of stages of staggered resonator fabrication in accordance with a process, for instance, as represented in FIG. 16 or FIG. 17. FIGS. 19A-19G show examples of perspective views of stages of staggered resonator fabrication in accordance with a process, for instance, as represented in FIG. 16 or FIG. 17.

Figure 18A:
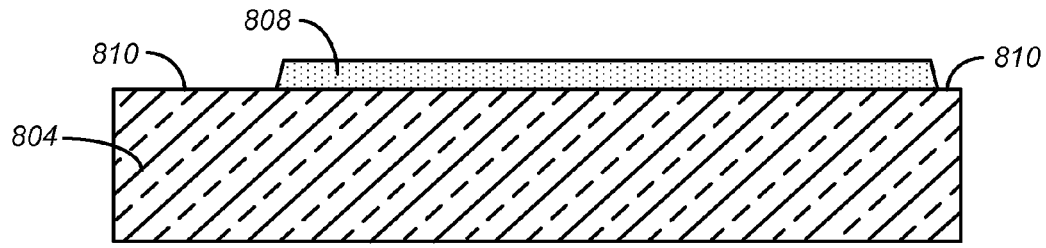
FIGS. 18A-18G show examples of cross-sectional schematic illustrations of stages of staggered resonator fabrication in accordance with a process, for instance, as represented in FIG. 16 or FIG. 17.
Figure 18B:
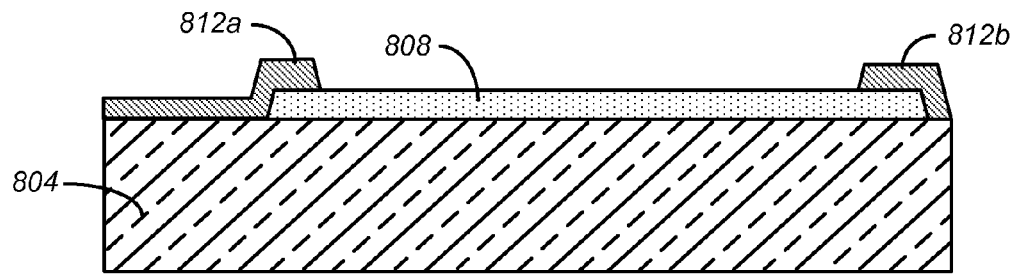
Figure 18C:
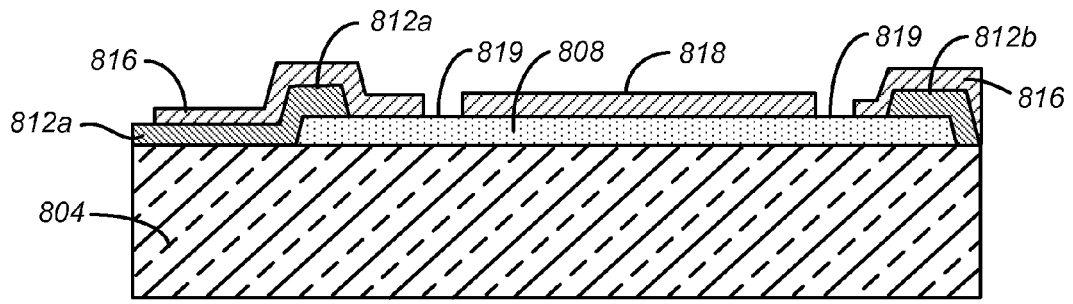
Figure 18D:
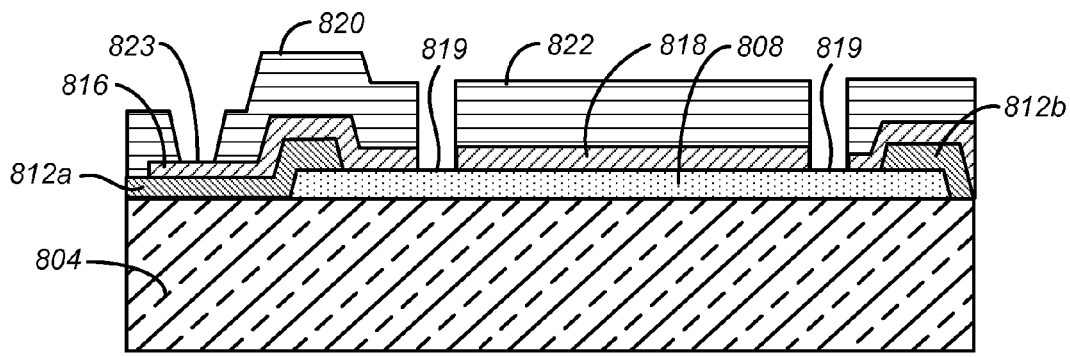
Figure 18E:
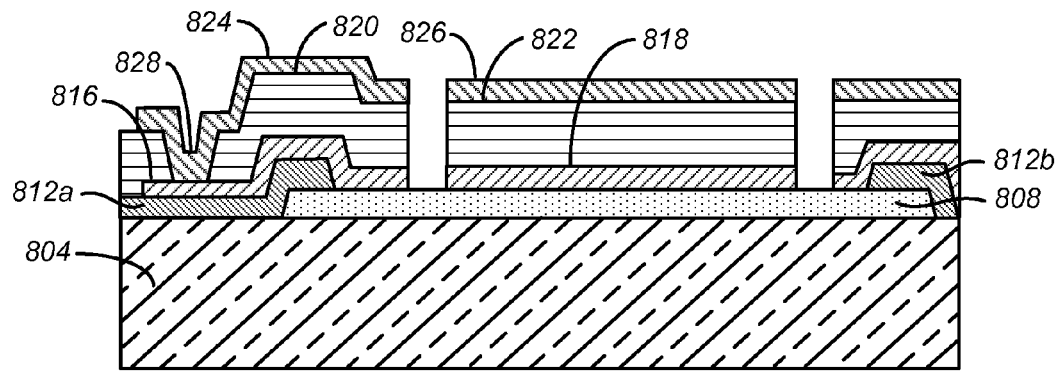
Figure 18F:
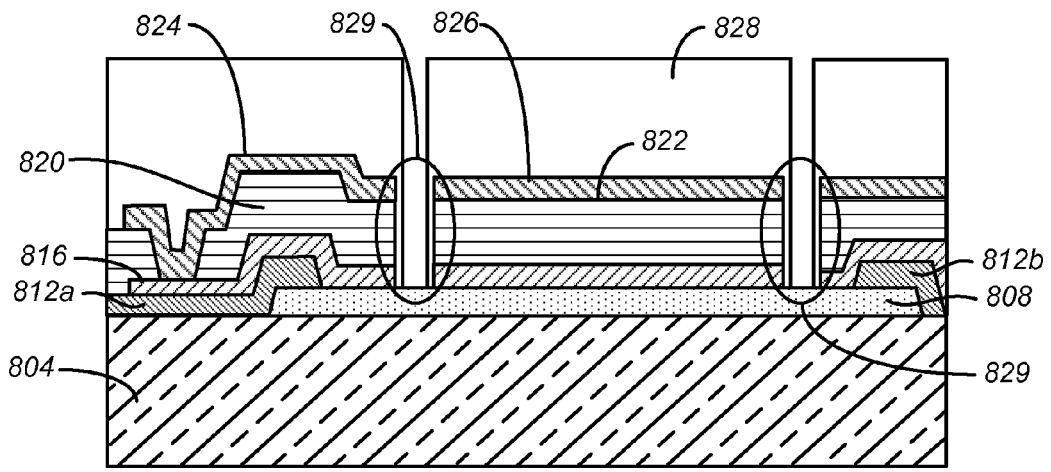
Figure 18G:
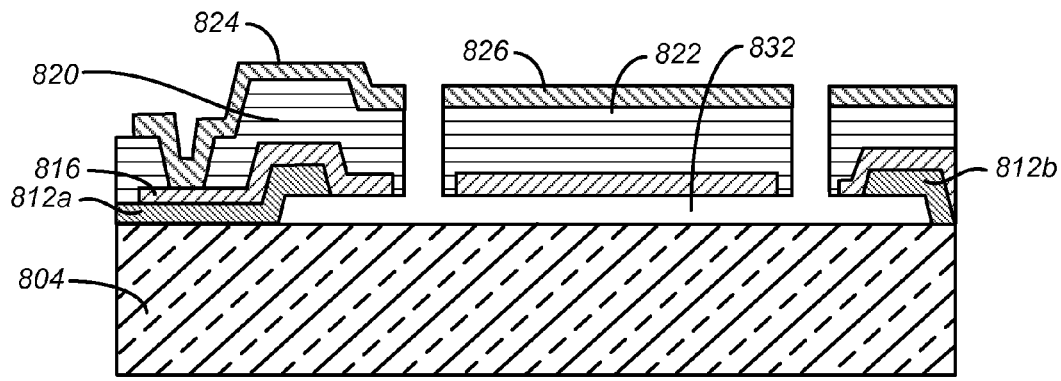
Figure 19A:
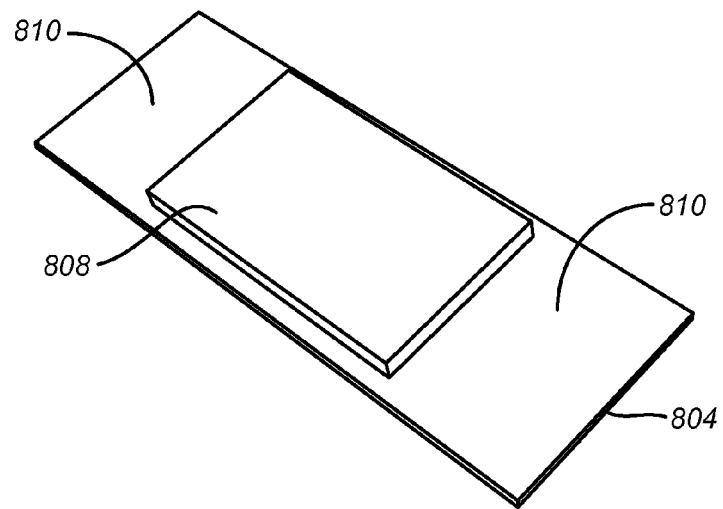
FIGS. 19A-19G show examples of perspective views of stages of staggered resonator fabrication in accordance with a process, for instance, as represented in FIG. 16 or FIG. 17.

In FIG. 17, the process 1700 begins in block 704 in which a SAC layer 808 is deposited on a glass substrate 804, as shown in FIGS. 18A and 19A. To form the staggered structure of FIGS. 18 and 19, in block 708, SAC layer 808 is patterned using an appropriately shaped and aligned mask such that SAC layer 808 overlays a portion of substrate 804 and exposes end portions 810 of the surface of substrate 804 on respective ends of SAC layer 808. The SAC layer 808 defines a region in which a cavity will be formed to substantially isolate the resonator structure from the substrate 804, as further described below. The SAC layer 808 can be formed of silicon oxynitride (SiON), silicon oxide (SiOx), molybdenum (Mo), germanium (Ge), amorphous silicon (a-Si), polycrystalline silicon, and/or various polymers, for example. In some implementations of the process 700, a suitable thickness of SAC layer 808 is in the range of about 0.5 micrometers (um) to 3 um. In one example, SAC layer 808 is formed of Mo and has a thickness of about 0.5 um.

Figure 19B:
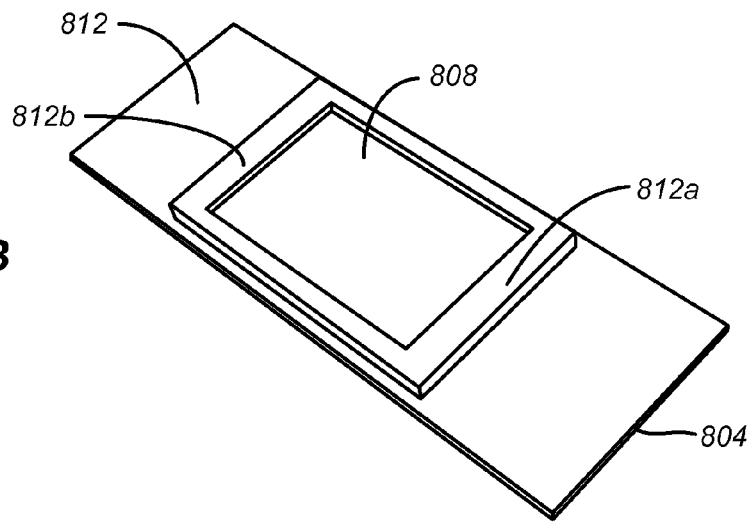

In block 712, a post oxide layer 812 is deposited over SAC layer 808 and exposed surface portions 810 of glass substrate 804. In block 716, to form the staggered structure of FIGS. 18 and 19, the post oxide layer 812 is patterned using an appropriate mask to expose a top portion of the sacrificial layer 808, as shown in FIGS. 18B and 19B. The remaining portions 812a and 812b of the post oxide layer define anchor structures on sides of the structure, as shown in FIGS. 18B and 19B, covering surface portions 810 of substrate 804. The post oxide layer 812 can be formed of materials such as SiOx and SiON and have a thickness, for example, on the order of about 1 um to 3 um. In some other implementations, post oxide layer 812 can be formed of nickel silicide (NiSi) or molybdenum silicide ($MoSi_2$). In some examples, post oxide layer 812 is about 0.5 um, or can be thicker, in the range of about 3 um to 5 um.

Figure 19C:
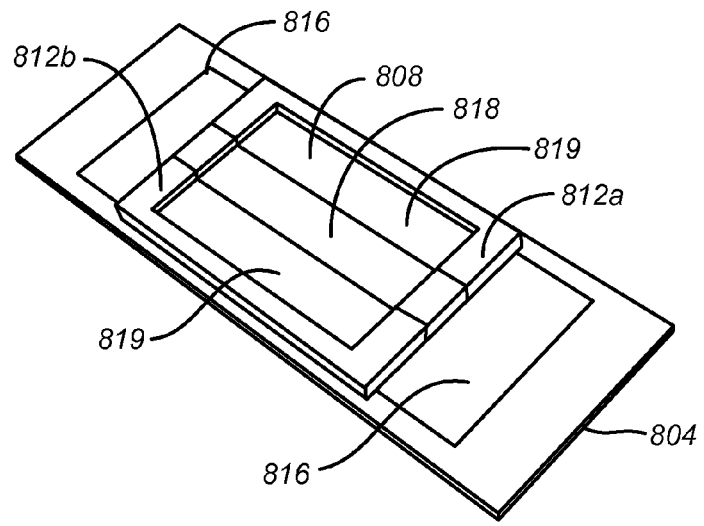
Figure 19D:
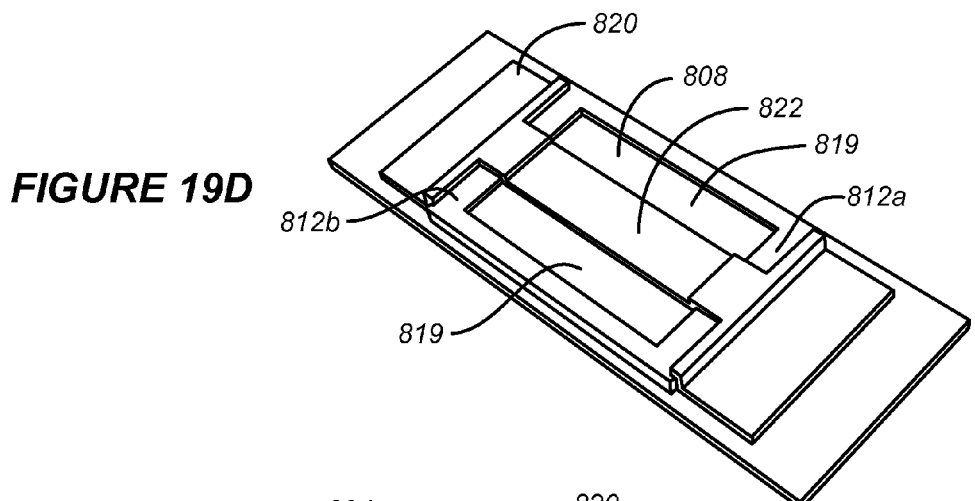

In block 720, a first metal layer 816 is deposited such that it overlays the post oxide anchors 812a and 812b as well as the exposed region of SAC layer 808. Metal layer 816 can be formed of aluminum (Al), Al/titanium nitride (TiN)/Al, aluminum copper (AlCu), Mo, or other appropriate materials, and have a thickness of 750 to 3000 Angstroms depending on the desired implementation. In some cases, the metal layer 816 is deposited as a bi-layer with a metal such as Mo deposited on top of a seed layer such as AlN. An appropriate thickness for the seed layer can be, for example, 100 to 1000 Angstroms. When Mo is used, the total thickness of the metal layer 816 can be about 3000 Angstroms. Other suitable materials for metal layer 816 include aluminum silicon (AlSi), AlCu, Ti, TiN, Al, platinum (Pt), nickel (Ni), tungsten (W), ruthenium (Ru), and combinations thereof. Thicknesses can range from about 0.1 um to 0.3 um, depending on the desired implementation. As shown in FIGS. 18C and 19C, in block 724, the first metal layer 816 is patterned using, for instance, an appropriate mask to define one or more lower electrodes 818. In some implementations, the one or more lower electrodes can be shaped to match overlaying upper electrodes. In the example of FIGS. 18C and 19C, metal layer 816 is formed to have a single electrode 818 in the shape of a strip, which extends laterally across the SAC layer 808 and exposes the SAC layer 808 on sides 819 of the strip, as shown in FIG. 19C. The exposed areas 819 of the SAC layer 808 in FIG. 19C are shown as vias in the cross section depicted by FIGS. 18C-18G, for purposes of illustration.

In block 728, a piezoelectric layer, e.g., film 820, is deposited on the structure. In block 732, the piezoelectric film 820 is patterned using an appropriate mask such that strip 822 of the piezoelectric film 820 directly overlays the lower electrode portion 818, shown in FIGS. 18D and 19D. Again, as with the deposition and formation of the lower electrode layer 818, side areas 819 of the SAC layer 808 remain exposed from above. The piezoelectric layer can be formed of AlN and have a thickness, for example, between about 1 um and 2 um. In one example, an AlN piezoelectric film has a thickness of about 1.2 um. Piezoelectric film 820 is patterned at one end of the structure to have one or more vias 823, exposing a portion of the first metal layer 816 for conductive contact to be made to the first metal layer 816, as shown in FIG. 18D.

Figure 19E:
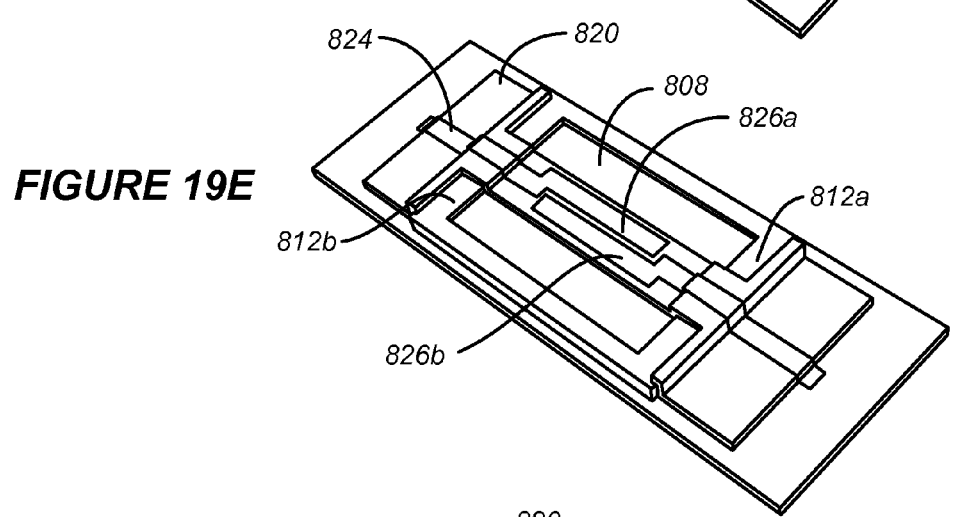

In FIG. 17, a second metal layer 824 is deposited and patterned, in blocks 736 and 740, to define upper electrodes 826, as shown in FIGS. 18E and 19E. The second metal layer 824 can be formed of AlCu, for example, as well as other materials as described above for forming the first metal layer 816. In one example, the second metal layer 824 is formed of AlCu, and has a thickness of about 2000 Angstroms. Other suitable thicknesses range from about 0.1 um to 0.3 um. As illustrated in FIG. 19E, when second metal layer 824 is patterned, in some implementations, a pair of adjacent electrodes 826a and 826b is formed. In some implementations, the electrodes 826a and 826b have longitudinal axes extending along the structure from opposite ends, as shown in FIG. 19E. Thus, the respective electrodes 826a and 826b can be connected to different ports, depending on the desired configuration of input and output signals using the resonator structure. In some implementations, a contact region 828 of the second metal layer 824 can be deposited in via 823 so the first and second metal layers are in conductive contact with one another.

Following the formation of the second metal layer 824, a release protection layer 828 such as AlOx can be deposited in block 744 using atomic layer deposition (ALD), physical vapor deposition (PVD), or other appropriate techniques and patterned in block 748 to protect sidewalls 829 of the electrodes in the first and second metal layers 816 and 824 and the sandwiched piezoelectric layer 820, as shown in FIG. 18F. Blocks 744 and 748 of FIG. 17 can be omitted in some implementations. In some implementations, the release protection layer 828 is patterned in block 748 to overlay the second metal layer 824, as shown in FIG. 18F. The side areas 819 remain exposed. The release protection layer 828 can be formed of SiON, and have a thickness of about 5000 Angstroms. The release protection layer 828 can then be removed after release of the SAC layer 808.

Figure 19F:
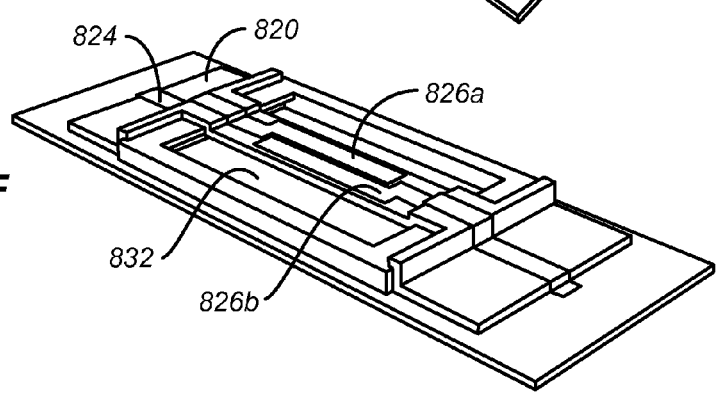
Figure 19G:
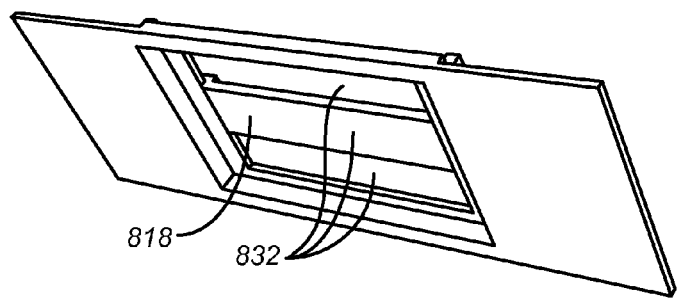

In block 752, the SAC layer 808 is then removed to define an air cavity 832, as shown in FIGS. 18G and 19F. In some implementations, the SAC layer 808 is released by exposing the structure to $XeF_2$ gas or $SF_6$ plasma, for instance, when the SAC layer 808 is formed of Mo or a-Si. HF can be used when the SAC layer 808 is formed of SiON or SiOx. FIG. 19G shows a perspective back view of the resulting resonator structure, with substrate 804 not shown to better illustrate cavity 832. The cavity 832 region is essentially defined by the absence of the SAC layer 808; thus, the cavity 832 includes side areas 819 and a portion underlying the first metal strip 818 of the resonator.

Following block 752, a metal interconnect layer can be deposited and patterned outside of the resonator structure to define transmission lines to the first and second metal layers 816 and 824. AlSi, AlCu, plated Cu, or other appropriate material can be used to form the metal interconnect layer.

Figure 20:
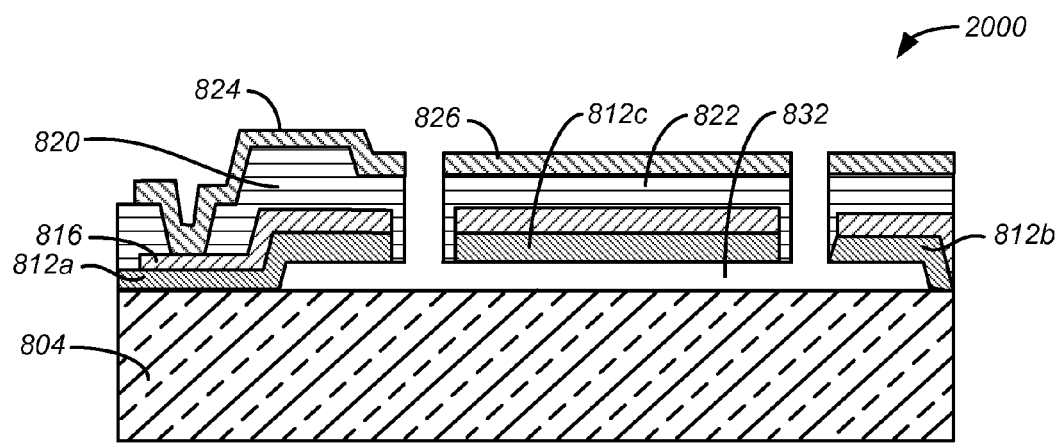
FIG. 20 shows an example of a cross-sectional schematic illustration of a temperature-compensated resonator structure.

FIG. 20 shows an example of a cross-sectional schematic illustration of a temperature-compensated resonator structure. The temperature compensated structure 2000 of FIG. 20 can be fabricated using the same processes as described above with respect to FIGS. 17-19, with a slight variation. Here, the post oxide layer 812 is patterned in block 716 such that a strip of the post oxide layer 812c remains and underlies the lower electrode(s) 818. In some implementations, the post oxide strip 812c is aligned with the overlaying lower electrode 818, the piezoelectric layer 822, and the upper electrodes 826 of the resonator structure. This strip 812c defines a temperature compensation layer for the resonator structure. The thickness of the post oxide layer 812 as a temperature compensation layer is often dependent on the choice of materials for the piezoelectric and electrode layers. In one case where the piezoelectric material is AlN, the electrodes are AlCu, Mo or a combination of both, and the post oxide layer is SiO2, the thickness for the SiO2 layer is of comparable magnitude to the thickness of the AlN layer.

In FIG. 20, the temperature compensation layer 812c provides resonators with a lower magnitude temperature-coefficient of frequency (TCF). This can be achieved by the selection of an appropriate material and layer thicknesses, as described above, for the post oxide layer 812, which serves as the thin-film compensation layer.

Figure 21:
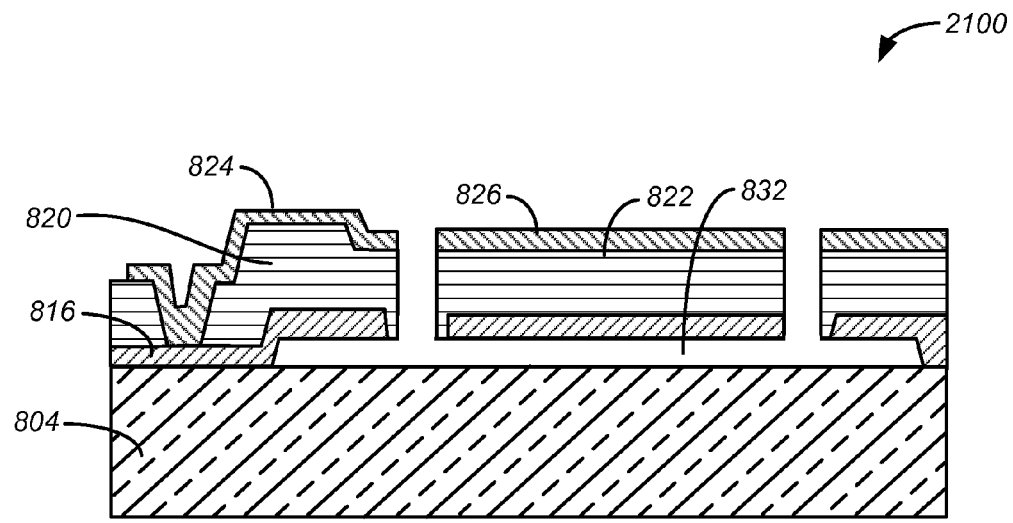
FIG. 21 shows an example of a cross-sectional schematic illustration of an airgap resonator structure.

FIG. 21 shows an example of a cross-sectional schematic illustration of an airgap resonator structure. The airgap structure 2100 of FIG. 21 also can be fabricated using essentially the same processes as described above with respect to FIGS. 17-19. Here, blocks 712 and 716 have been omitted, so that no post oxide layer is formed. The lower electrode layer is thus deposited and patterned in blocks 720 and 724 so that it directly overlays the SAC layer 808 and the exposed areas 810 of the substrate 804. The remaining fabrication blocks can be performed as described above with respect to FIGS. 17-19.

Figure 22:
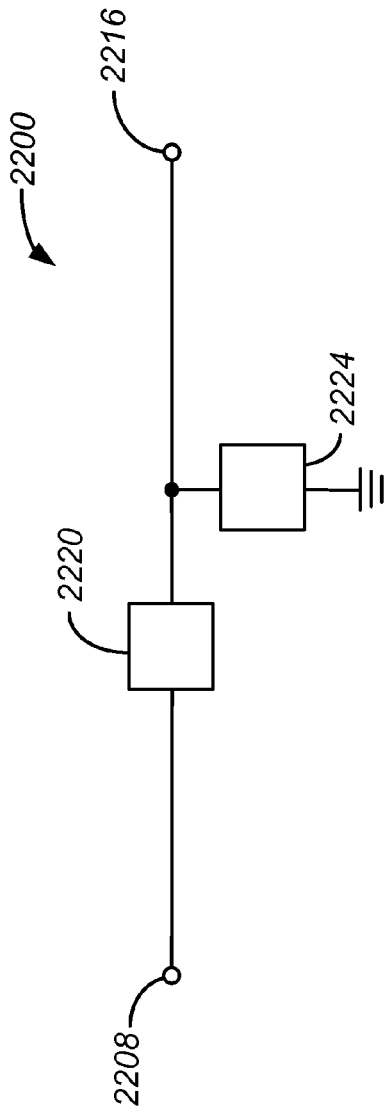
FIG. 22 shows an example of a circuit diagram of a ladder filter incorporating resonators such as DMRs.
Figure 22:
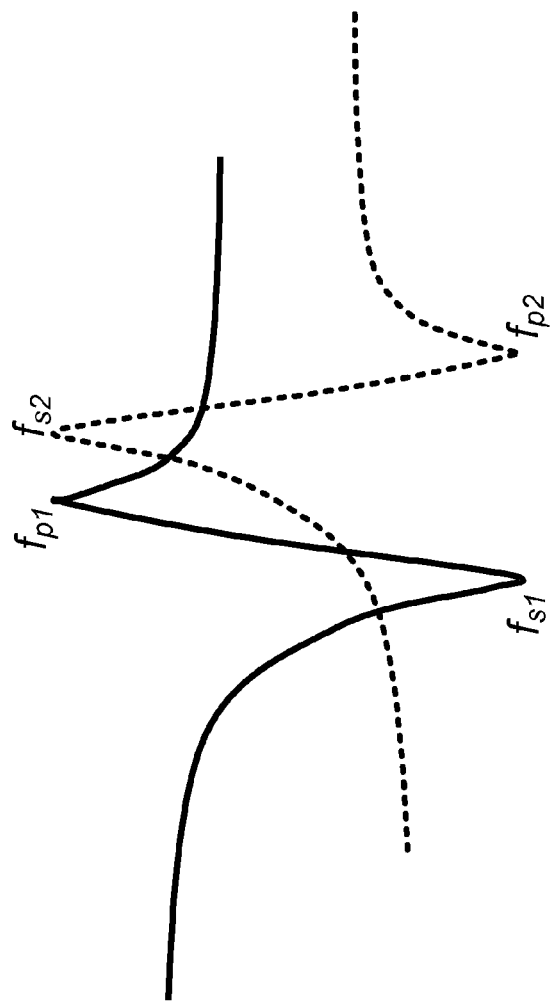

FIG. 22 shows an example of a circuit diagram of a ladder filter incorporating resonators such as DMRs. In FIG. 22, the circuit 2200 includes a series resonator 2220 and a shunt resonator 2224, both of which can be implemented as DMRs as described above. The series resonator 2220 is coupled in series, with an electrode in one conductive layer, such as the upper conductive layer, coupled to an input terminal 2208, and an electrode in the same or different conductive layer coupled to an output terminal 2216. The selection of electrodes of the resonator 2220 to be coupled to the input terminal 2208 and the output terminal 2216 will depend on which of the DMR structures described above are implemented in circuit 2200. Any of the DMR structures described above can be used. In some implementations, when the example of FIG. 1 has a single electrode in the upper conductive layer 104 and a single electrode in the lower conductive layer 108, either upper conductive layer 104 or lower conductive layer 108 can be coupled to input terminal 2208, and the other conductive layer can be coupled to output terminal 2216.

In FIG. 22, the circuit 2200 further includes a shunt resonator 2224. The possible implementations of series resonator 2220 described are generally applicable to shunt resonator 2224. For example, an upper conductive layer of the shunt resonator 2224 can be coupled to the output terminal 2216 (or in some implementations, the input terminal 2208), and a lower conductive layer of the shunt resonator 2224 can be coupled to ground, or vice versa. In FIG. 22, the series resonator 2220 and shunt resonator 2224 connected as shown represent one stage of possible additional stages of series and shunt resonators in some implementations.

In FIG. 22, the series resonator 2220 has an intrinsic resonant frequency response to an input AC signal delivered to input port 2204, as generally described in the examples above. In some implementations, the series resonator 2220 has a series resonant frequency, "fs2," and a parallel resonant frequency, "fp2." The shunt resonator 2224, tuned (or designed) to have a different resonant frequency response in this example, includes a series resonant frequency, "fs1," and a parallel resonant frequency, "fp1." Because resonator 2224 is coupled as a shunt component, that is, with an input electrode coupled to the output terminal 2216 and an output electrode coupled to ground, in this example, the actual transmission response between the input terminal 2208 and output terminal 2216 due to the impact of the shunt resonator 2224 is an inverted version of the resonator's own transmission response, as shown, such that the frequency response of the circuit 2200 includes the illustrated adjacent frequency peaks of fp1 and fs2, which can define a bandwidth of the ladder filter circuit 2200 in various applications. That is, the intrinsic transmission response of the shunt resonator 2224 as a separate component would ordinarily have fp1 as a null frequency and fs1 as a peak frequency. To realize the desired frequency response of circuit 2200, the series resonator 2220 is tuned to a higher frequency than the shunt resonator 2224. The bandwidth of the ladder filter is thus determined by fs2-fp1 in this example. This bandwidth can be controlled by adjusting fs2 or fp1, that is, by engineering the resonant frequency responses of the individual resonators 2220 and 2224. For instance, in the case of a DMR, a relative lateral distance (width or length) and a thickness of the piezoelectric layer can be set to achieve a numerical ratio of the thickness and the lateral distance producing the desired series and parallel resonant frequencies.

Figure 23A:
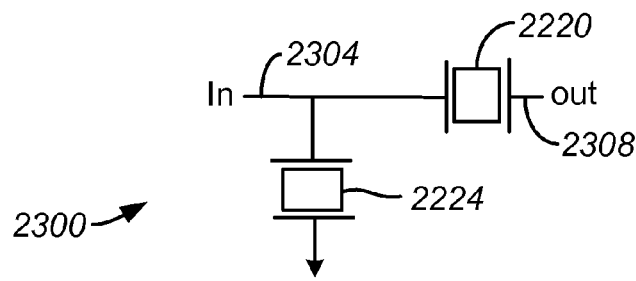
FIG. 23A shows an example of a simplified circuit diagram of a single stage ladder filter incorporating resonators such as DMRs.

FIG. 23A shows an example of a simplified circuit diagram of a single stage ladder filter incorporating resonators such as DMRs. In FIG. 23A, the circuit 2300 includes a shunt resonator 2224 coupled between an input terminal 2304 and ground and a series resonator 2220 coupled between input terminal 2304 and an output terminal 2308. The resonators can be DMRs as described above, and can have different conductive layer and electrode configurations as described above with respect to FIG. 22.

Figure 23B:
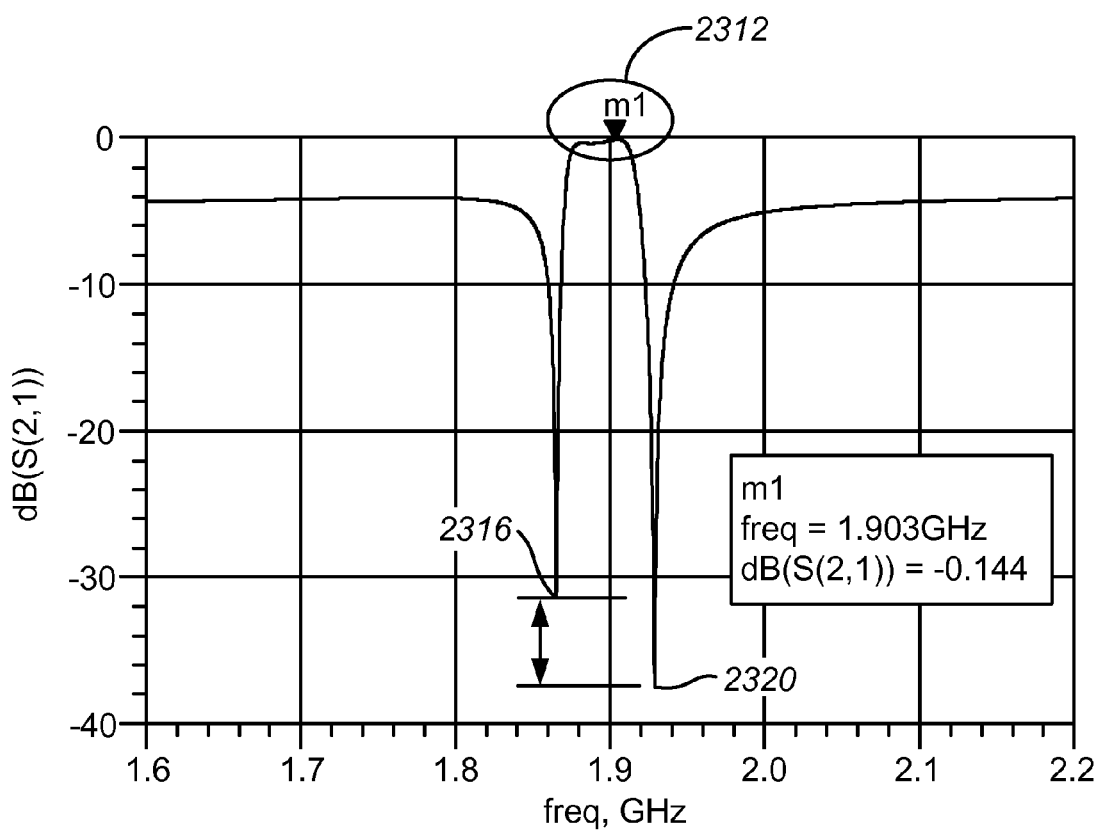
FIG. 23B shows an example of an electrical transmission response of the ladder filter circuit of FIG. 23A.

FIG. 23B shows an example of an electrical transmission response of the ladder filter circuit 2300 of FIG. 23A. In this example, a passband 2312 is defined between an fs2 peak, associated with series resonator 2220 as described above, and an fp1 peak, associated with shunt resonator 2224 as described above. In this example, a left null 2316 corresponding to fs1 and a right null 2320 corresponding to fp2 in FIG. 22 have different amplitudes due to the different mechanisms causing the null. The null 2316 can be caused by the series resonance of the shunt resonator 2224, while the null 2320 can be caused by parallel resonance of the series resonator 2220. The two different resonators may have different Q values and different impedances, in addition to different sizes. In particular, left null 2316 has an amplitude of about −32 dB, while right null 2320 has an amplitude of about −38 dB.

Figure 24A:
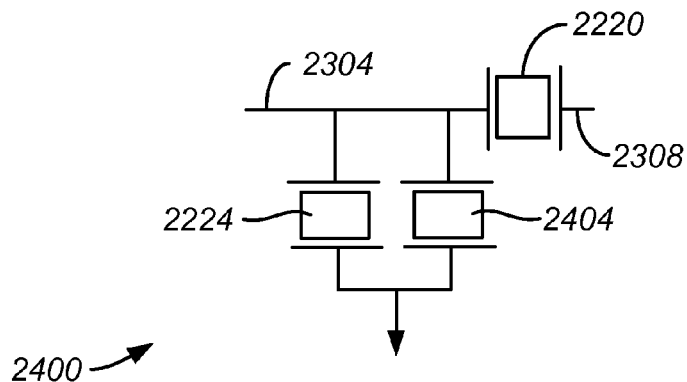
FIG. 24A shows an example of a simplified circuit diagram of a single stage ladder filter incorporating parallel shunt resonators such as DMRs.
Figure 24B:
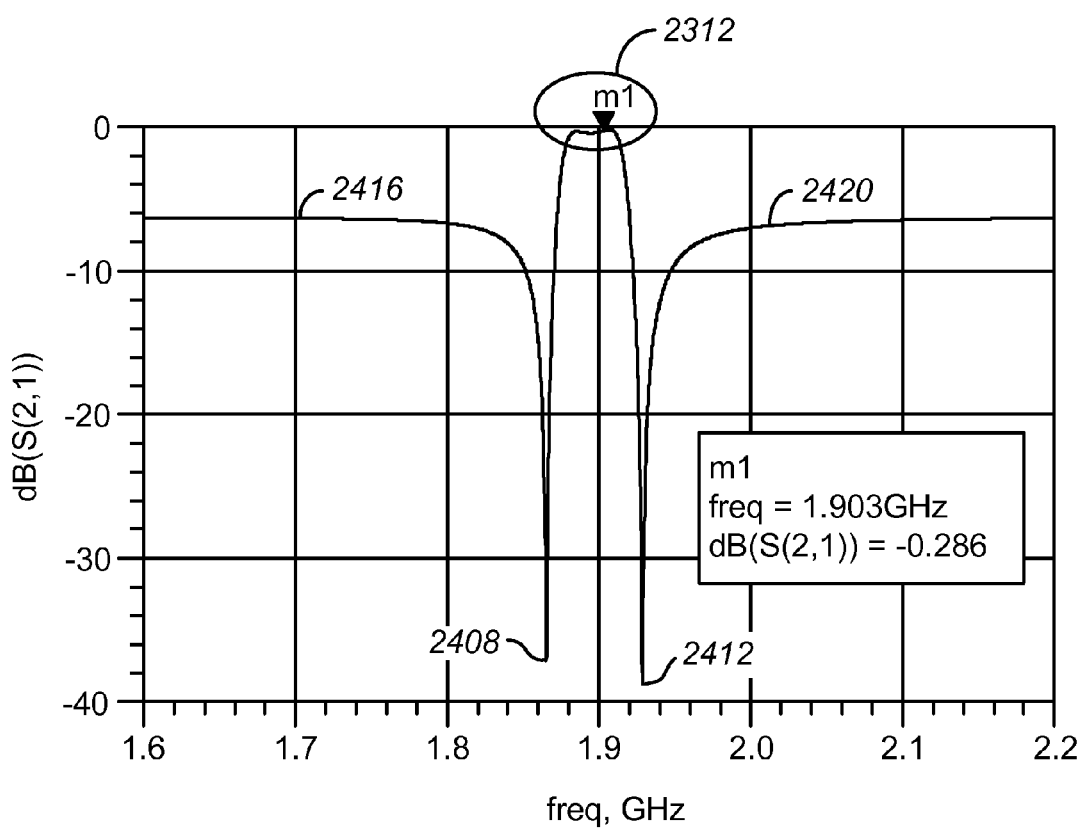
FIG. 24B shows an example of an electrical transmission response of the ladder filter circuit of FIG. 24A.

FIG. 24A shows an example of a simplified circuit diagram of a single stage ladder filter incorporating parallel shunt resonators such as DMRs. The ladder filter circuit 2400 includes the same components and interconnections of circuit 2300, while also including an additional shunt resonator 2404 coupled in parallel with shut resonator 2224. FIG. 24B shows an example of an electrical transmission response of the ladder filter circuit of FIG. 24A. In FIG. 24B, a left null 2408 and a right null 2412 have similar amplitudes, due to the inclusion of the second shunt resonator 2404 to effectively make the shunt resonator larger (with two resonators electrically in parallel) with smaller motional resistance. In particular, left null 2408 has a lower amplitude of about −36 dB, while right null 2412 still has an amplitude of about −38 dB. Also, the inclusion of the parallel shunt resonator 2404 provides some increased out-of-band attenuation in rejection regions 2416 and 2420, which have an amplitude of about −6 dB, as opposed to amplitudes of about −4 dB in corresponding regions of FIG. 23B.

Figure 25A:
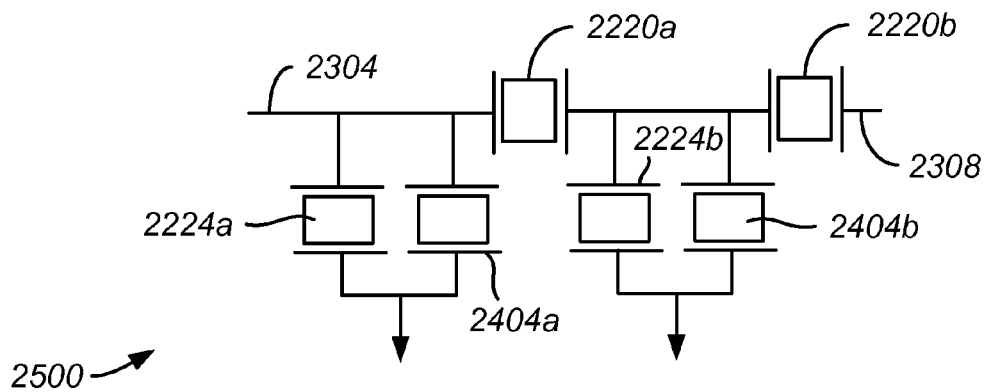
FIG. 25A shows an example of a simplified circuit diagram of a two-stage ladder filter incorporating parallel shunt resonators such as DMRs.
Figure 25B:
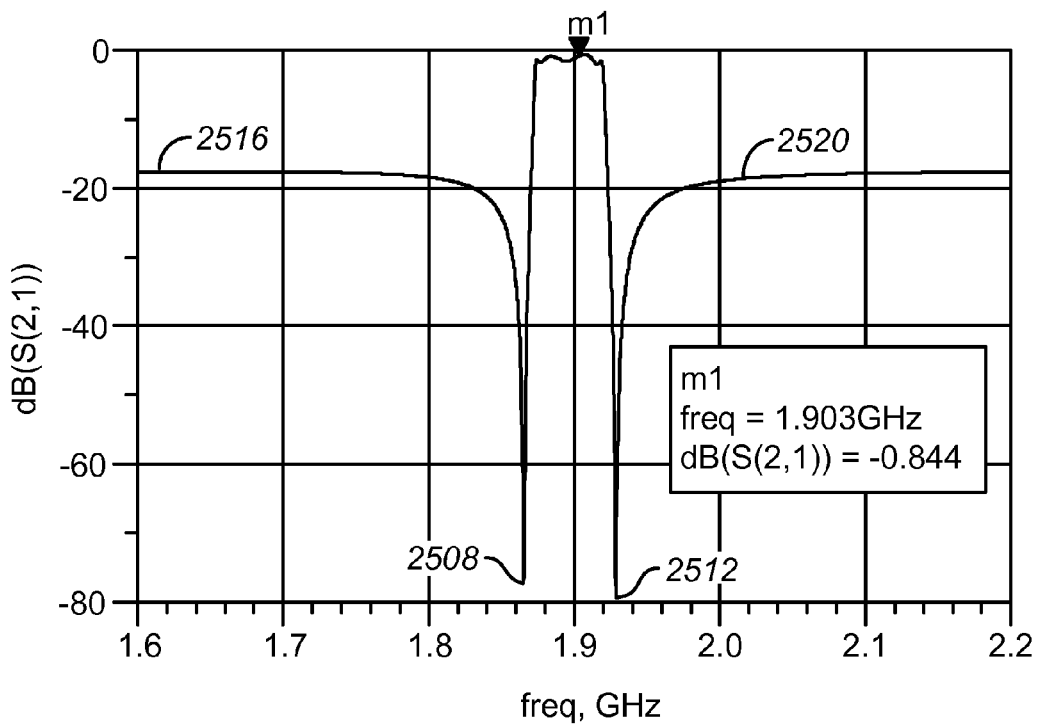
FIG. 25B shows an example of an electrical transmission response of the ladder filter circuit of FIG. 25A.

FIG. 25A shows an example of a simplified circuit diagram of a two-stage ladder filter incorporating parallel shunt resonators such as DMRs. The ladder filter circuit 2400 includes two stages of the same components and interconnections of circuit 2400, with a first stage including parallel shunt resonators 2224a and 2404a and series resonator 2220a connected as described above, and a second stage including parallel shunt resonators 2224b and 2404b and series resonator 2220b connected as described above. Here, the series resonator 2220b is coupled between series resonator 2220a and output terminal 2308, and parallel shunt resonators 2224b and 2404b are coupled to a node between the two series resonators 2220a and 2220b. FIG. 25B shows an example of an electrical transmission response of the ladder filter circuit of FIG. 25A. In FIG. 25B, the inclusion of the additional stage provides some increased attenuation in out-of-band rejection regions 2516 and 2520, which have an amplitude of about −18 dB, as opposed to amplitudes of about −6 dB in corresponding regions of FIG. 24B. The null 2508 and 2512 amplitudes are also reduced to about −80 dB.

While a ladder filter circuit can be implemented with two stages, as shown in FIG. 25A, other implementations include any number of additional stages, which can provide additional attenuation in rejection regions 2516 and 2520.

Figure 26A:
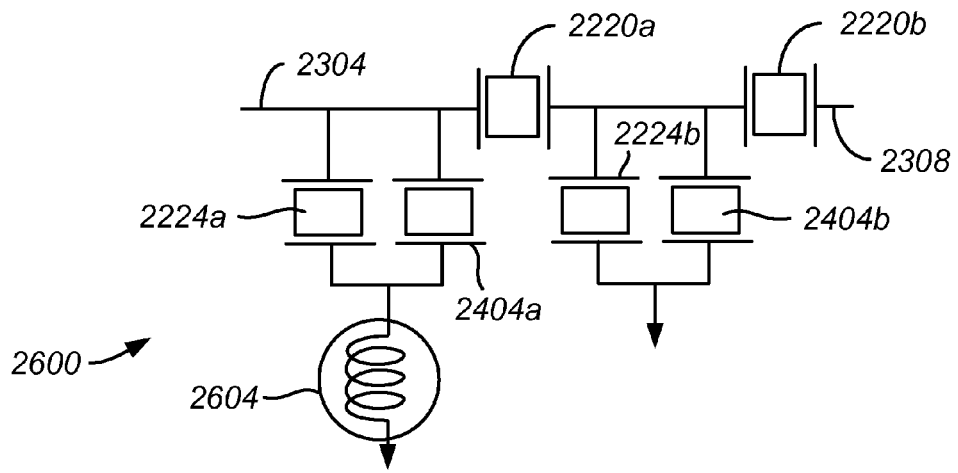
FIG. 26A shows an example of a simplified circuit diagram of a two-stage ladder filter incorporating a shunt inductor.
Figure 26B:
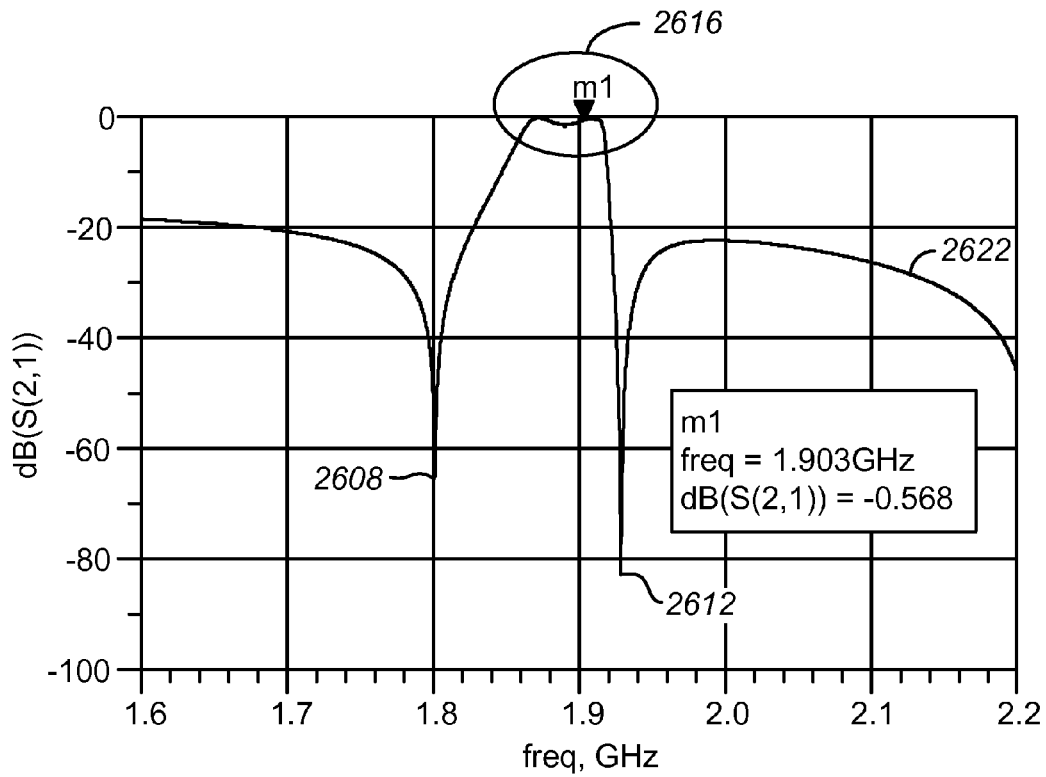
FIG. 26B shows an example of an electrical transmission response of the ladder filter circuit of FIG. 26A.

FIG. 26A shows an example of a simplified circuit diagram of a two-stage ladder filter incorporating a shunt inductor. The ladder filter circuit 2600 has the two stages of components and interconnections of circuit 2500, with the addition of an inductor 2604 coupled between the parallel shunt resonators 2224a and 2404a and ground in one of the stages. Such shunt inductors such as inductor 2604 can have inductance values generally in the nH range, although larger values can be used depending on the desired implementation. Such an inductor 2604 can be fabricated on the same substrate or on a different substrate than the resonators in the circuit 2600. A shunt inductor also can be parasitic or intentionally fabricated inductance from the wirebonding, packaging, and/or other interconnections. Thus, the illustrated circuit diagram is applicable to both one-chip, two-chip, and multi-chip implementations. FIG. 26B shows an example of an electrical transmission response of the ladder filter circuit of FIG. 26A. In FIG. 26B, the inclusion of the inductor 2604 provides a parameter to control the left null frequency 2608 and, accordingly, adjust the roll-off slope of a passband region 2616. For instance, the left null frequency 2608 can be lowered from its value in FIG. 25B (about 1.86 GHz) to about 1.80 GHz. Higher frequency components in a higher frequency rejection region 2622 also can be attenuated with the circuit 2600 of FIG. 26A.

Figure 27A:
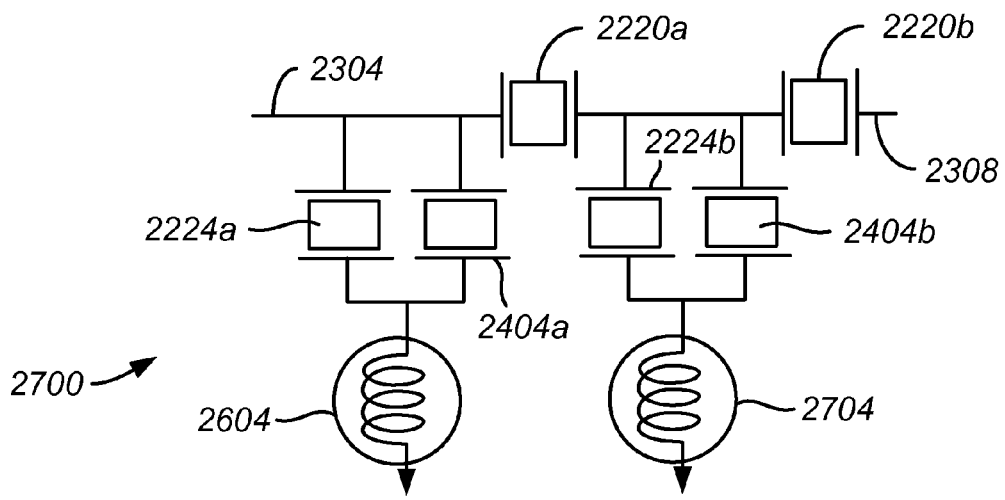
FIG. 27A shows an example of a simplified circuit diagram of a two-stage ladder filter incorporating a shunt inductor in each stage.
Figure 27B:
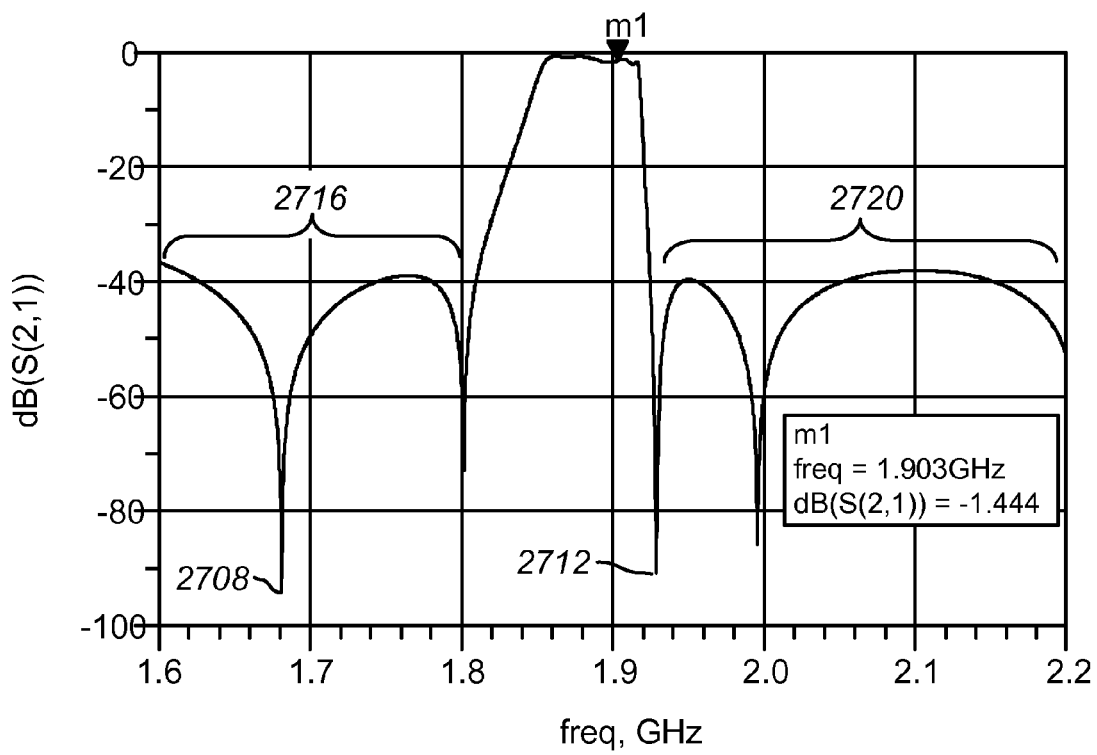
FIG. 27B shows an example of an electrical transmission response of the ladder filter circuit of FIG. 27A.

FIG. 27A shows an example of a simplified circuit diagram of a two-stage ladder filter incorporating a shunt inductor in each stage. The ladder filter circuit 2700 has the two stages of components and interconnections of circuit 2600, with the addition of an inductor 2704 (generally in the nH range) coupled between the parallel shunt resonators 2224b and 2404b and ground in the other stage. FIG. 27B shows an example of an electrical transmission response of the ladder filter circuit of FIG. 27A. In FIG. 27B, the inclusion of the inductor 2704 provides an additional parameter to enhance the attenuation of higher and lower frequency components in rejection regions 2716 and 2720. In this example, the second inductor 2704 provides additional null frequencies 2708 and 2712, which are higher and lower, respectively, than the null frequencies 2608 and 2612 of FIG. 26B. Thus, the incorporation of shunt inductors 2604 and 2704 can provide additional out-of-band attenuations for both higher and lower frequency components of the electrical transmission response of circuit 2700.

As shown in the examples above, the bandwidths of the passbands of the disclosed ladder filter circuits can be controlled by adjusting the resonant frequencies of the series and/or shunt resonators, which is different from conventional ladder filter designs, where the series resonant frequency of the series resonator is equal to (or very close to) the parallel resonant frequency of the shunt resonator. The same concept also can be applied to Lattice or Hybrid filter topologies that are similar to the Ladder topology. Also, as the number of ladder filter stages increases, so does the amount of out-of-band attenuation, as does the rate of transition from null frequencies to the peaks (fp1 and fs2) defining the passband region. As the number of shunt inductors increases, for instance, in FIGS. 26A and 27A, the out-of-band attenuation is enhanced, and the bandwidth of the passband can be further fine-tuned, for example, increased in the example above. Out-of-band attenuation can generally be controlled by adding more stages and/or including more shunt inductors.

Figure 28:
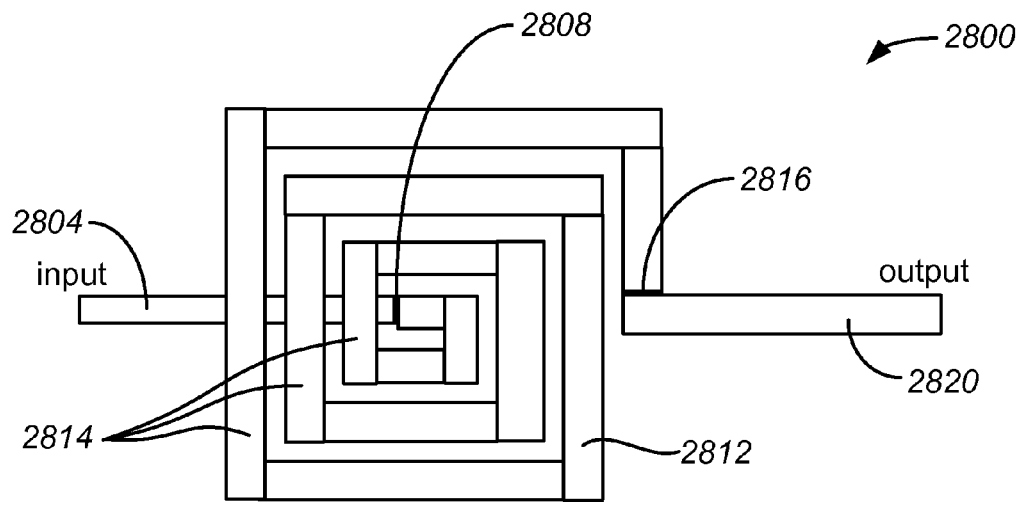
FIG. 28 shows an example of a top view of a resonator structure having a spiral shape in a lateral plane.

FIG. 28 shows an example of a top view of a resonator structure having a spiral shape in a lateral plane, such as a plane parallel with the X-Y plane in the DMR examples above. In FIG. 28, the resonator structure 2800 can be a DMR, in some implementations. In some other implementations, the resonator structure 2800 can be a different piezoelectric resonator such as a laterally vibrating piezoelectric resonator or an FBAR. In the example of FIG. 28, the structure 2800 is fabricated to have one or more conductive layers and a piezoelectric layer as described above. An input electrode 2804 is situated in one lateral plane, for instance, in a lower conductive layer of the structure. The input electrode connects to one of the conductive layers of the resonator structure 2800 at an inner endpoint 2808 of the spiral-shaped piezoelectric material 2812. Portions of the input electrode 2804 are underlying spiral segments 2814 of the piezoelectric material 2812, parts of which can be disposed over the lower conductive layer as described in the fabrication techniques above. The piezoelectric material 2812, along with portions of one or more conductive layers above and/or below the piezoelectric material 2812, is patterned to have its length in a spiral configuration as shown, with concentric turns terminating at an outer endpoint 2816 coupled to an output electrode 2820. In this example, the output electrode 2820 is situated in a different lateral plane vertically offset (e.g., along a Z axis) from the input electrode 2804, for instance, in an upper conductive layer of the structure.

In some other implementations, the electrode connections can be switched, such that input electrode 2804 serves as an output, and output electrode 2820 serves as an input. Also, while some implementations of the spiral resonator structure 2800 have a rectangular shape, as shown in FIG. 28, part or all of the spiral structure can have a contour of a generally circular shape, an oval shape, or an octagonal shape, depending on the desired application. A total length of the piezoelectric material, that is, winding around the turns of the structure 2800 between the inner endpoint 2808 and the outer endpoint 2816, can be set according to resistance and capacitance specifications of a circuit in which the spiral resonator structure 2800 is to be incorporated. For instance, an amplifier or other electrical component can be coupled to input electrode 2804, and such a component can have an impedance, which is desirably matched by resonator structure 2800. The total length 2824 can be set to determine the appropriate matching impedance.

Figure 29:
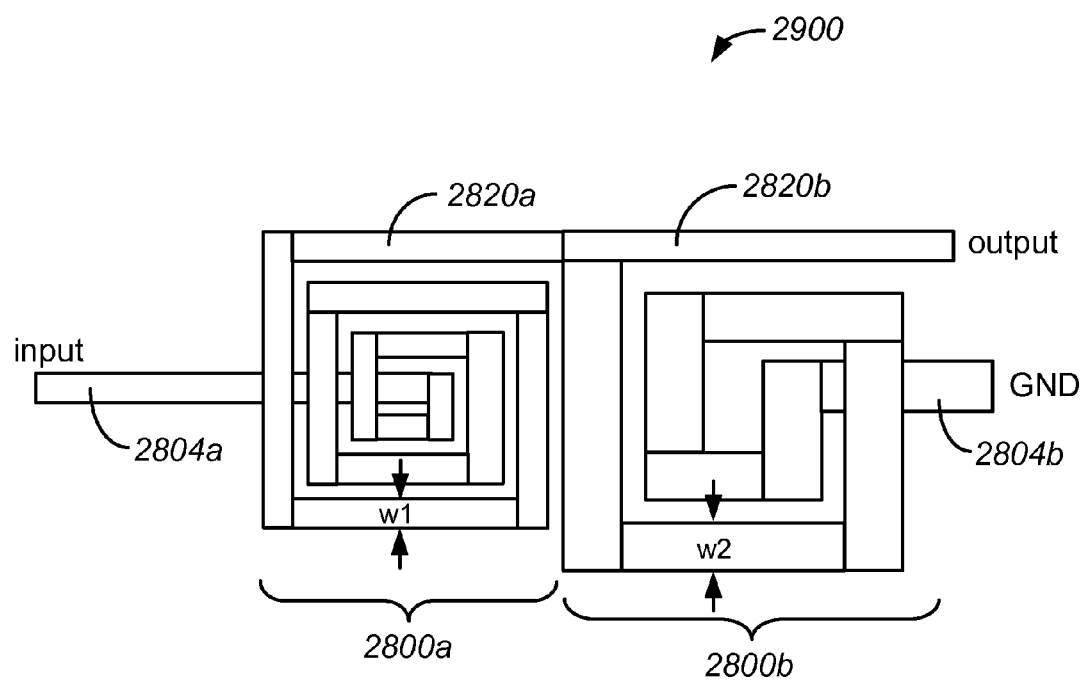
FIG. 29 shows an example of a ladder filter circuit incorporating spiral-shaped resonator structures.

FIG. 29 shows an example of a ladder filter circuit incorporating spiral-shaped resonator structures. In ladder filter circuit 2900, a first structure 2800a as described above with respect to FIG. 28 has an input electrode 2804a connected to input terminal 2208 of FIG. 22 and an output electrode 2820a. A second structure 2800b has a first electrode 2804b coupled to ground and a second electrode 2820b. The electrodes 2820a and 2820b of the respective resonators are connected to the same output terminal 2216 of FIG. 22, thus substituting spiral-shaped resonator structures 2800a and 2800b for respective resonators 2220 and 2224 in the circuit of FIG. 22. The respective resonant frequencies of resonator structures 2800a and 2800b can be set by one or more parameters, depending on the type of resonator, e.g., DMR, laterally vibrating resonator, FBAR, etc. For instance, when the resonator structures are laterally vibrating, a width of the resonator can govern its resonant frequency. In this example, resonator structure 2800a has a width, "w1," causing structure 2800a to resonate with resonant frequencies fp2 and fs2, as described above, and resonator structure 2800b has a width, "w2," causing structure 2800b to resonate with resonant frequencies fp1 and fs1, also as described above. In some examples, when resonator structures 2800a and 2800b are implemented as DMRs, each resonator structure can have its own relative lateral distance (width or length) and thickness of the piezoelectric layer set to achieve a numerical ratio of the thickness and the lateral distance to produce the desired series and parallel resonant frequencies.

In FIGS. 28 and 29, the number of turns, i.e., windings in each spiral can be set according to circuit specifications, such as impedance and/or capacitance parameters. Generally, the number of turns determines the intrinsic capacitance of the resonator. A larger surface area structure with wider electrodes can cause motional resistance to drop. Also, in some ladder filter implementations in which shunt inductors are incorporated, for instance, in FIGS. 26A and 27A, a shunt inductor can be implemented as a conductive layer of the spiral-shaped resonator. That is, the upper or lower conductive layer of the resonator also can serve as the shunt inductor.

The piezoelectric materials that can be used in fabrication of the piezoelectric layers of electromechanical systems resonators and dielectric layers of passive components disclosed herein include, for example, aluminum nitride (AlN), zinc oxide (ZnO), gallium arsenide (GaAs), aluminum gallium arsenide (AlGaAs), gallium nitride (GaN), quartz and other piezoelectric materials such as zinc-sulfide (ZnS), cadmium-sulfide (CdS), lithium tantalite (LiTaO3), lithium niobate (LiNbO3), lead zirconate titanate (PZT), members of the lead lanthanum zirconate titanate (PLZT) family, doped aluminum nitride (AlN:Sc), and combinations thereof. The conductive layers described above may be made of various conductive materials including platinum (Pt), aluminum (Al), molybdenum (Mo), tungsten (W), titanium (Ti), niobium (Nb), ruthenium (Ru), chromium (Cr), doped polycrystalline silicon, doped aluminum gallium arsenide (AlGaAs) compounds, gold (Au), copper (Cu), silver (Ag), tantalum (Ta), cobalt (Co), nickel (Ni), palladium (Pd), silicon germanium (SiGe), doped conductive zinc oxide (ZnO), and combinations thereof. In various implementations, the upper metal electrodes and/or the lower metal electrodes can include the same conductive material(s) or different conductive materials.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device or system that can be configured to display an image, whether in motion (e.g., video) or stationary (e.g., still image), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (i.e., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS), microelectromechanical systems (MEMS) and non-MEMS applications), aesthetic structures (e.g., display of images on a piece of jewelry) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

An example of a suitable EMS or MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity, and thereby affect the reflectance of the interferometric modulator. The reflectance spectrums of IMODs can create fairly broad spectral bands, which can be shifted across the visible wavelengths to generate different colors. The position of the spectral band can be adjusted by changing the thickness of the optical resonant cavity, i.e., by changing the position of the reflector.

Figure 30A:
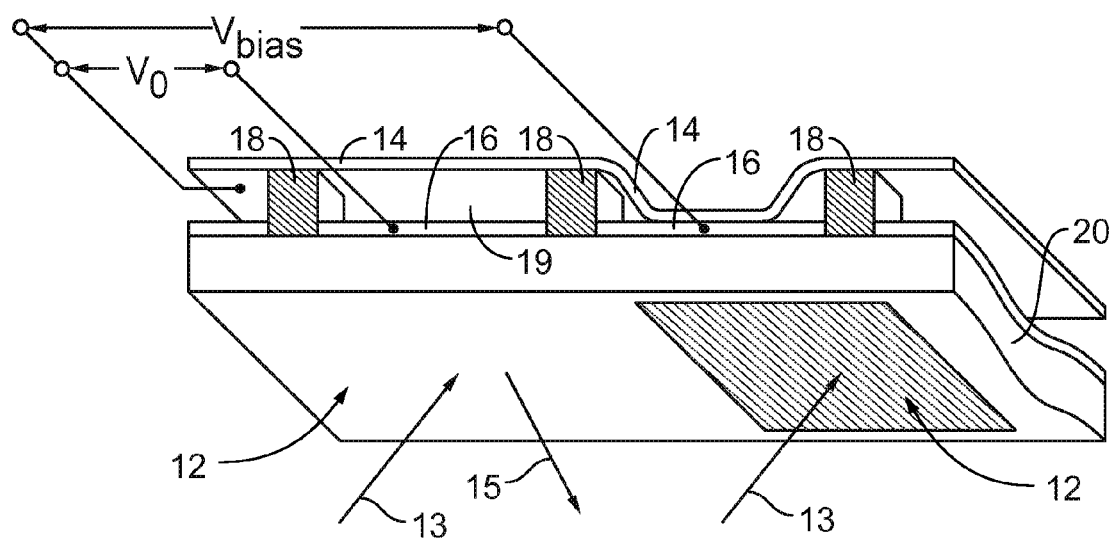
FIG. 30A shows an example of an isometric view depicting two adjacent pixels in a series of pixels of an interferometric modulator (IMOD) display device.

FIG. 30A shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 30A includes two adjacent interferometric modulators 12. In the IMOD 12 on the left (as illustrated), a movable reflective layer 14 is illustrated in a relaxed position at a predetermined distance from an optical stack 16, which includes a partially reflective layer. The voltage V0 applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage Vbias applied across the IMOD 12 on the right is sufficient to maintain the movable reflective layer 14 in the actuated position.

In FIG. 30A, the reflective properties of pixels 12 are generally illustrated with arrows 13 indicating light incident upon the pixels 12, and light 15 reflecting from the IMOD 12 on the left. Although not illustrated in detail, it will be understood by one having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the IMOD 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the separation between posts 18 may be approximately 1-1000 um, while the gap 19 may be less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the IMOD 12 on the left in FIG. 30A, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated IMOD 12 on the right in FIG. 30A. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 30B:
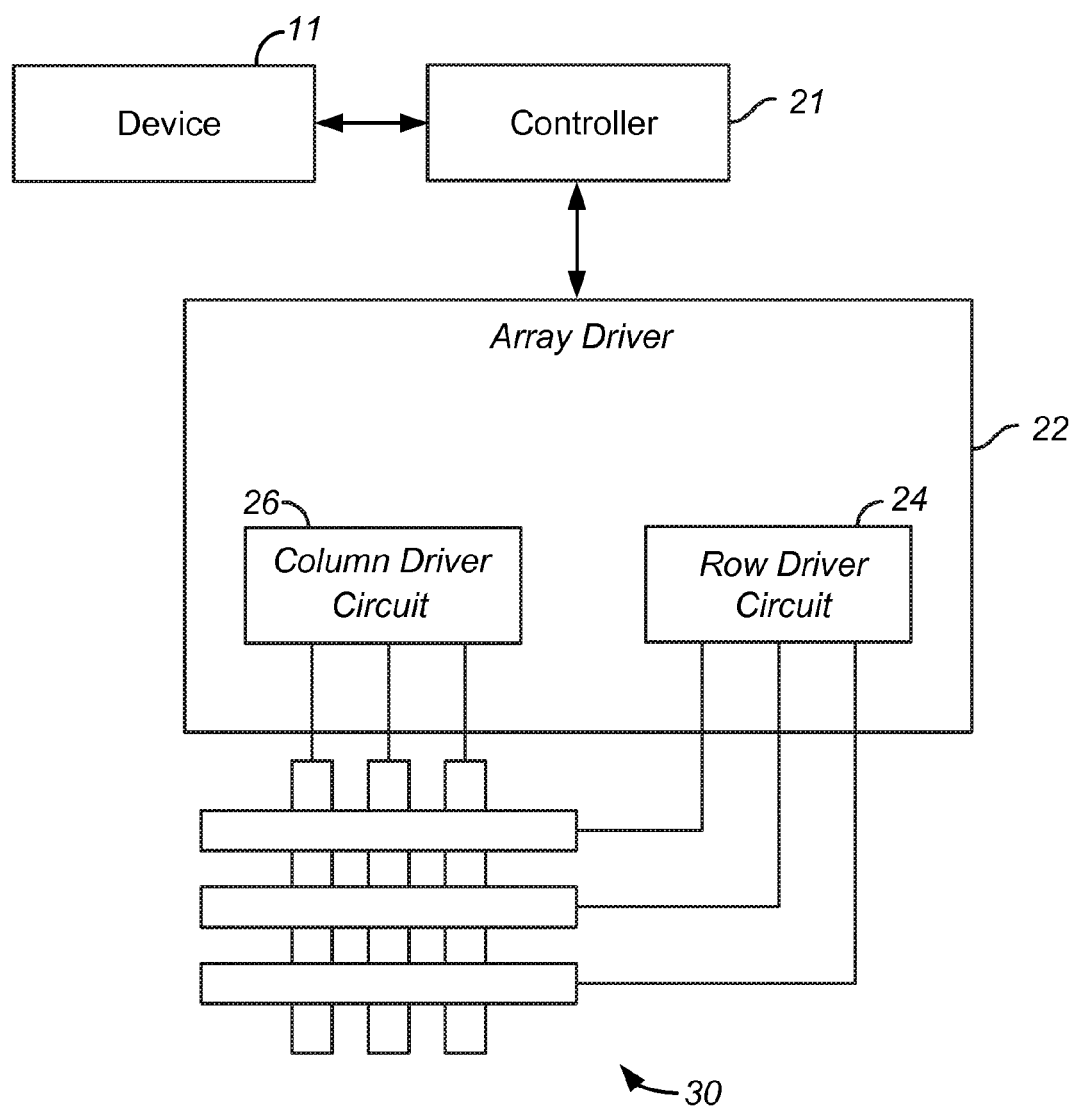
FIG. 30B shows an example of a system block diagram illustrating an electronic device incorporating an interferometric modulator display.

FIG. 30B shows an example of a system block diagram illustrating an electronic device incorporating a 3×3 interferometric modulator (IMOD) display. The electronic device of FIG. 30B represents one implementation in which a device 11 constructed in accordance with any of the implementations described above with respect to FIGS. 1-29, including resonator structures and/or circuits such as ladder filters can be incorporated. The electronic device in which device 11 is incorporated may, for example, form part or all of any of the variety of electrical devices and electromechanical systems devices set forth above, including both display and non-display applications.

Here, the electronic device includes a controller 21, which may include one or more general purpose single- or multi-chip microprocessors such as an ARM®, Pentium®, 8051, MIPS®, Power PC®, or ALPHA®, or special purpose microprocessors such as a digital signal processor, microcontroller, or a programmable gate array. Controller 21 may be configured to execute one or more software modules. In addition to executing an operating system, the controller 21 may be configured to execute one or more software applications, including a web browser, a telephone application, an email program, or any other software application.

The controller 21 is configured to communicate with device 11. The controller 21 also can be configured to communicate with an array driver 22. The array driver 22 can include a row driver circuit 24 and a column driver circuit 26 that provide signals to, e.g., a display array or panel 30. Although FIG. 30B illustrates a 3×3 array of IMODs for the sake of clarity, the display array 30 may contain a very large number of IMODs, and may have a different number of IMODs in rows than in columns, and vice versa. Controller 21 and array driver 22 may sometimes be referred to herein as being "logic devices" and/or part of a "logic system."

Figure 31A:
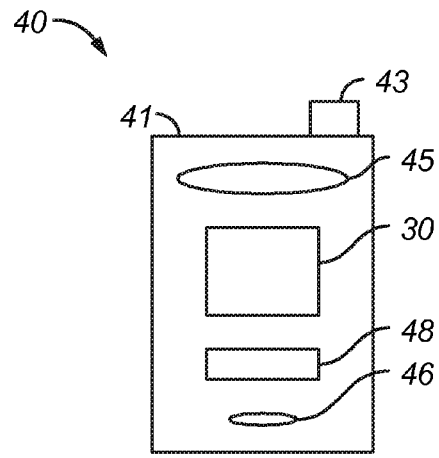
FIGS. 31A and 31B show examples of system block diagrams illustrating a display device that includes a plurality of interferometric modulators.
Figure 31B:
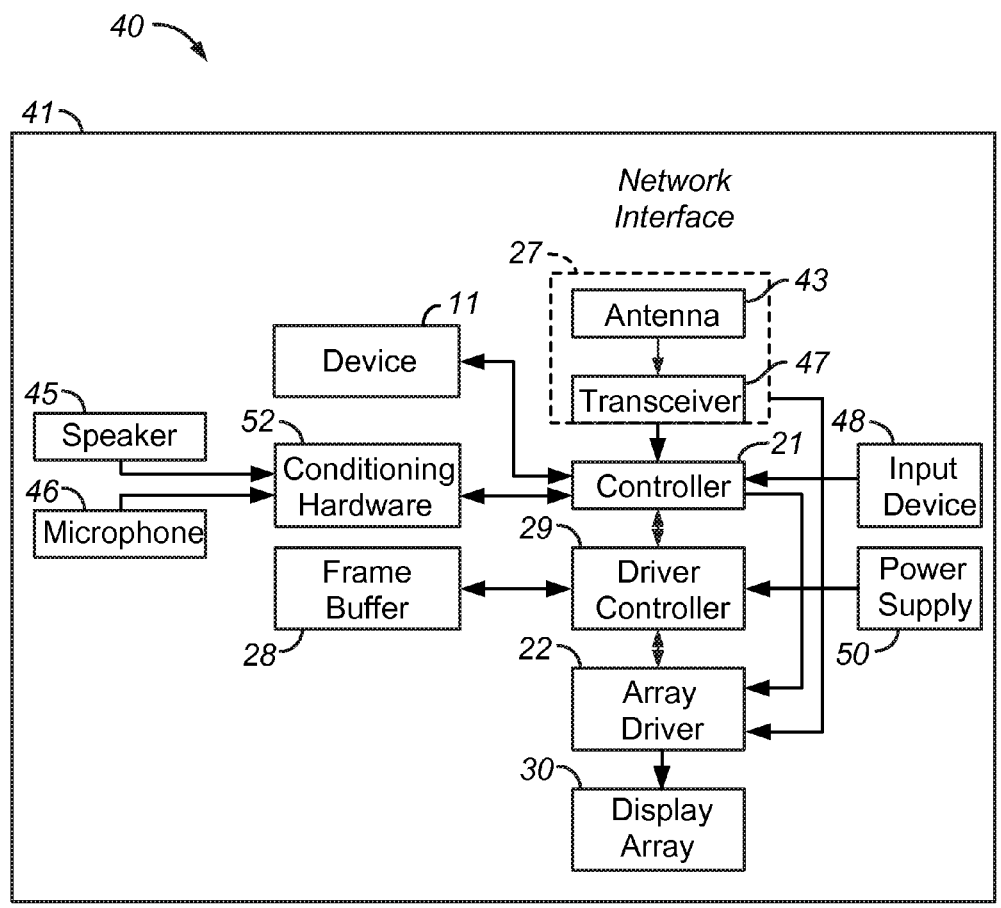

FIGS. 31A and 31B show examples of system block diagrams illustrating a display device 40 that includes a plurality of interferometric modulators. The display device 40 can be, for example, a smart phone, a cellular or mobile telephone. However, the same components of the display device 40 or slight variations thereof are also illustrative of various types of display devices such as televisions, tablets, e-readers, hand-held devices and portable media players.

The display device 40 includes a housing 41, a display 30, an antenna 43, a speaker 45, an input device 48, and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber, and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 31B. The display device 40 includes a housing 41 and can include additional components at least partially enclosed therein. For example, the display device 40 includes a network interface 27 that includes an antenna 43, which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. In some implementations, a power system 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1x EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation, and gray-scale level. Controller 21 is also configured to interact with device 11 to perform desired operations.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components. In some implementations, device 11 is incorporated as a component of conditioning hardware 52.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone integrated circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (such as an IMOD controller). Additionally, the array driver 22 can be a conventional driver or a bi-stable display driver (such as an IMOD display driver). Moreover, the display array 30 can be a conventional display array or a bi-stable display array (such as a display including an array of IMODs). In some implementations, the driver controller 29 can be integrated with the array driver 22. Such an implementation can be useful in highly integrated systems, for example, mobile phones, portable-electronic devices, watches or other small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power system 50 can include a variety of energy storage devices. For example, the power system 50 may include a rechargeable battery, such as a nickel-cadmium battery or a lithium-ion battery. In implementations using a rechargeable battery, the rechargeable batter may be chargeable using power coming from, for example, a wall socket of a photovoltaic device or array. Alternatively, the rechargeable batter can be wirelessly chargeable. The power system 50 also can include a renewable energy source, a capacitor, or a solar cell, including a plastic solar cell or solar-cell paint. The power system 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations. The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, e.g., a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A piezoelectric resonator structure, comprising:
  a first conductive layer including at least one electrode;
  a second conductive layer including at least one electrode;
  a piezoelectric layer between the first conductive layer and the second conductive layer to define a resonator, each section of the resonator capable of vibrating with displacement along an X axis, a Y axis and a Z axis responsive to at least one signal provided to the at least one electrode of the first conductive layer or the at least one electrode of the second conductive layer, the piezoelectric layer being a rectangular solid having a width (W) along the X axis, a length (L) along the Y axis, and a thickness (T) along the Z axis, each of the X axis, the Y axis and the Z axis being perpendicular to one another;
  the displacement of each section of the resonator along each of the X axis and the Z axis being dependent on a numerical ratio of the thickness and the width, T/W;
  the displacement of each section of the resonator along each of the Y axis and the Z axis being dependent on a numerical ratio of the thickness and the length, T/L; and
  a substrate including a cavity therein or thereon, the resonator being adjacent the cavity.

2. The piezoelectric resonator structure of claim 1, wherein at least one of the numerical ratio T/W and the numerical ratio T/L is in a numerical range of values in which an electromechanical coupling of the resonator structure depends on the respective numerical ratio according to a variable relationship.

3. The piezoelectric resonator structure of claim 1, wherein:
  the Z axis bisects the piezoelectric layer, and
  the displacement has a symmetrical shape with respect to the Z axis.

4. The piezoelectric resonator structure of claim 1, wherein the vibrating causes non-uniform displacement along the plane of the X axis and the Y axis.

5. The piezoelectric resonator structure of claim 1, wherein the displacement along the X axis, the Y axis and the Z axis depends on a combination of piezoelectric coefficients of a piezoelectric material of the piezoelectric layer.

6. The piezoelectric resonator structure of claim 5, wherein the combination of piezoelectric coefficients includes two or more piezoelectric coefficients selected from the group consisting of: a d31 coefficient, a d32 coefficient, a d33 coefficient, a d24 coefficient, and a d15 coefficient.

7. The piezoelectric resonator structure of claim 1, wherein the at least one electrode of the first conductive layer covers a substantial portion of a first surface of the piezoelectric layer, the first surface having the length L and the width W.

8. The piezoelectric resonator structure of claim 7, wherein the at least one electrode of the second conductive layer covers a substantial portion of a second surface of the piezoelectric layer, the second surface having the length L and the width W, the second surface being opposite the first surface.

9. The piezoelectric resonator structure of claim 1, wherein a piezoelectric material of the piezoelectric layer includes at least one material selected from the group consisting of: aluminum nitride (AlN), zinc oxide (ZnO), gallium arsenide (GaAs), aluminum gallium arsenide (AlGaAs), gallium nitride (GaN), quartz, zinc-sulfide (ZnS), cadmium-sulfide (CdS), lithium tantalite (LiTaO$_3$), lithium niobate (LiNbO$_3$), and lead zirconate titanate (PZT).

10. The piezoelectric resonator structure of claim 1, wherein the at least one electrode of the first conductive layer and the at least one electrode of the second conductive layer are longitudinally oriented along the Y axis.

11. The piezoelectric resonator structure of claim 10, wherein the at least one electrode of the second conductive layer includes at least two electrodes spaced apart from one another along the X axis, and wherein the at least one electrode of the first conductive layer includes at least two electrodes spaced apart from one another along the X axis.

12. The piezoelectric resonator structure of claim 11, wherein the at least two electrodes of the first conductive layer have a finger width, and wherein a resonant frequency of the structure is dependent on the finger width.

13. The piezoelectric resonator structure of claim 1 further comprising:
one or more tethers coupled to physically support the first and the second conductive layers and the piezoelectric layer adjacent the cavity.

14. Apparatus including:
the piezoelectric resonator structure of claim 1;
a display;
a processor capable of communicating with the display, the processor being capable of processing image data; and
a memory device capable of communicating with the processor.

15. The apparatus of claim 14 further comprising:
a driver circuit capable of sending at least one signal to the display; and
a controller capable of sending at least a portion of the image data to the driver circuit.

16. The apparatus of claim 14, wherein the first conductive layer includes at least two electrodes and wherein at least one of the at least two electrodes of the piezoelectric resonator structure is coupled to send the image data to the processor.

17. The piezoelectric resonator structure of claim 2, wherein the variable relationship is a substantially linear relationship.

18. A piezoelectric resonator structure, comprising:
a first conductive layer including at least one electrode;
a second conductive layer including at least one electrode;
a piezoelectric layer between the first conductive layer and the second conductive layer to define a resonator, each section of the resonator capable of vibrating with displacement along a Z axis and at least one of an X axis and a Y axis responsive to at least one signal provided to the at least one electrode of the first conductive layer or the at least one electrode of the second conductive layer, the piezoelectric layer being a rectangular solid having dimensions including a lateral distance (D), in a plane of the X axis and the Y axis, and a thickness (T), along the Z axis, each of the X axis, the Y axis and the Z axis being perpendicular to one another;
the displacement of each section of the resonator along the Z axis and along at least one of the X axis and the Y axis being dependent on a numerical ratio of the thickness and the lateral distance, T/D, the numerical ratio T/D being in a range of values in which an electromechanical coupling of the resonator structure depends on the numerical ratio T/D according to a variable relationship in which the electromechanical coupling increases as the ratio T/D increases; and
a substrate including a cavity therein or thereon, the resonator being adjacent the cavity.

19. The piezoelectric resonator structure of claim 18, wherein:
the lateral distance of the piezoelectric layer is a width along the X axis, and
the displacement of the piezoelectric layer occurs along the Z axis and along the X axis.

20. The piezoelectric resonator structure of claim 18, wherein:
the lateral distance of the piezoelectric layer is a length along the Y axis, and
the displacement of the piezoelectric layer occurs along the Z axis and along the Y axis.

21. The piezoelectric resonator structure of claim 18, wherein the vibrating causes displacement along the X axis, the Y axis and the Z axis.

22. The piezoelectric resonator structure of claim 18, wherein the variable relationship is a substantially linear relationship.

23. The piezoelectric resonator structure of claim 18, wherein the thickness T of the piezoelectric layer is in the range of approximately 1 micron to approximately 2 microns.

24. The piezoelectric resonator structure of claim 18, wherein the piezoelectric layer includes aluminum nitride (AlN) and wherein the value of the ratio T/D is in the range of approximately 1.0 to approximately 1.3.

25. The piezoelectric resonator structure of claim 18, wherein the piezoelectric layer includes zinc oxide (ZnO) and wherein the value of the ratio T/D is in the range of approximately 0.4 to approximately 1.6.

26. The piezoelectric resonator structure of claim 1, wherein the thickness T of the piezoelectric layer is in the range of approximately 1 micron to approximately 2 microns.

27. The piezoelectric resonator structure of claim 1, wherein the piezoelectric layer includes aluminum nitride (AlN).

28. The piezoelectric resonator structure of claim 27, wherein the value of the ratio T/W is in the range of approximately 1.0 to approximately 1.3.

29. The piezoelectric resonator structure of claim 27, wherein the value of the electromechanical coupling is greater than approximately 10%.

30. The piezoelectric resonator structure of claim 1, wherein the piezoelectric layer includes zinc oxide (ZnO).

31. The piezoelectric resonator structure of claim 30, wherein the value of the ratio T/W is in the range of approximately 0.4 to approximately 1.6.

32. The piezoelectric resonator structure of claim 30, wherein the value of the electromechanical coupling is greater than approximately 18%.

* * * * *